United States Patent
Huang et al.

(10) Patent No.: US 12,429,783 B2
(45) Date of Patent: Sep. 30, 2025

(54) EUV LITHOGRAPHY APPARATUS AND OPERATING METHOD FOR MITIGATING CONTAMINATION

(71) Applicant: TAIWAN SEMICONDUCTOR MANUFACTURING COMPANY, LTD., Hsinchu (TW)

(72) Inventors: I-Hsiung Huang, Hsinchu (TW); Yung-Cheng Chen, Jhubei (TW); Tung-Li Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 714 days.

(21) Appl. No.: 17/717,709

(22) Filed: Apr. 11, 2022

(65) Prior Publication Data
US 2023/0324814 A1    Oct. 12, 2023

(51) Int. Cl.
*G03F 7/00* (2006.01)
*B01D 39/20* (2006.01)
*B82Y 40/00* (2011.01)

(52) U.S. Cl.
CPC ...... *G03F 7/70916* (2013.01); *G03F 7/70033* (2013.01); *B01D 39/2065* (2013.01); *B82Y 40/00* (2013.01); *G03F 7/70025* (2013.01)

(58) Field of Classification Search
CPC ............. G03F 7/70916; G03F 7/70033; G03F 7/70025; G03F 7/7095
See application file for complete search history.

(56) References Cited

U.S. PATENT DOCUMENTS

| | | | |
|---|---|---|---|
| 2008/0225245 A1* | 9/2008 | Wood | G03F 7/70916 250/503.1 |
| 2020/0348599 A1* | 11/2020 | Bai | G03F 7/70066 |
| 2023/0044415 A1* | 2/2023 | Chao | G03F 1/62 |
| 2024/0069427 A1* | 2/2024 | Sun | G03F 1/22 |
| 2024/0094626 A1* | 3/2024 | Hsu | B82Y 30/00 |

FOREIGN PATENT DOCUMENTS

| | | | |
|---|---|---|---|
| DE | 102017221146 A1 * | 3/2018 | |
| WO | WO-2022050875 A1 * | 3/2022 | G03F 7/70916 |

OTHER PUBLICATIONS

Jonathan Kim et al., "Synthesis and Characterization of Transition Metal Dichalcogenide and Carbon Nanotube Coaxial Herostructures," https://e3s-center.berkeley.edu/wp-content/uploads/2017/09/Jonathan-Kim.pdf (Sep. 2017).

* cited by examiner

*Primary Examiner* — David P Porta
*Assistant Examiner* — Casey Bryant
(74) *Attorney, Agent, or Firm* — STUDEBAKER BRACKETT PLLC

(57) ABSTRACT

An extreme ultra violet (EUV) lithography apparatus includes a light source that generates an EUV light beam, a scanner that receives the light from a junction with the light source and directs the light to a reticle stage, and a debris catcher disposed on a EUV beam path between the light source and the scanner. The debris catcher includes a network membrane including a plurality of nano-fibers.

20 Claims, 21 Drawing Sheets

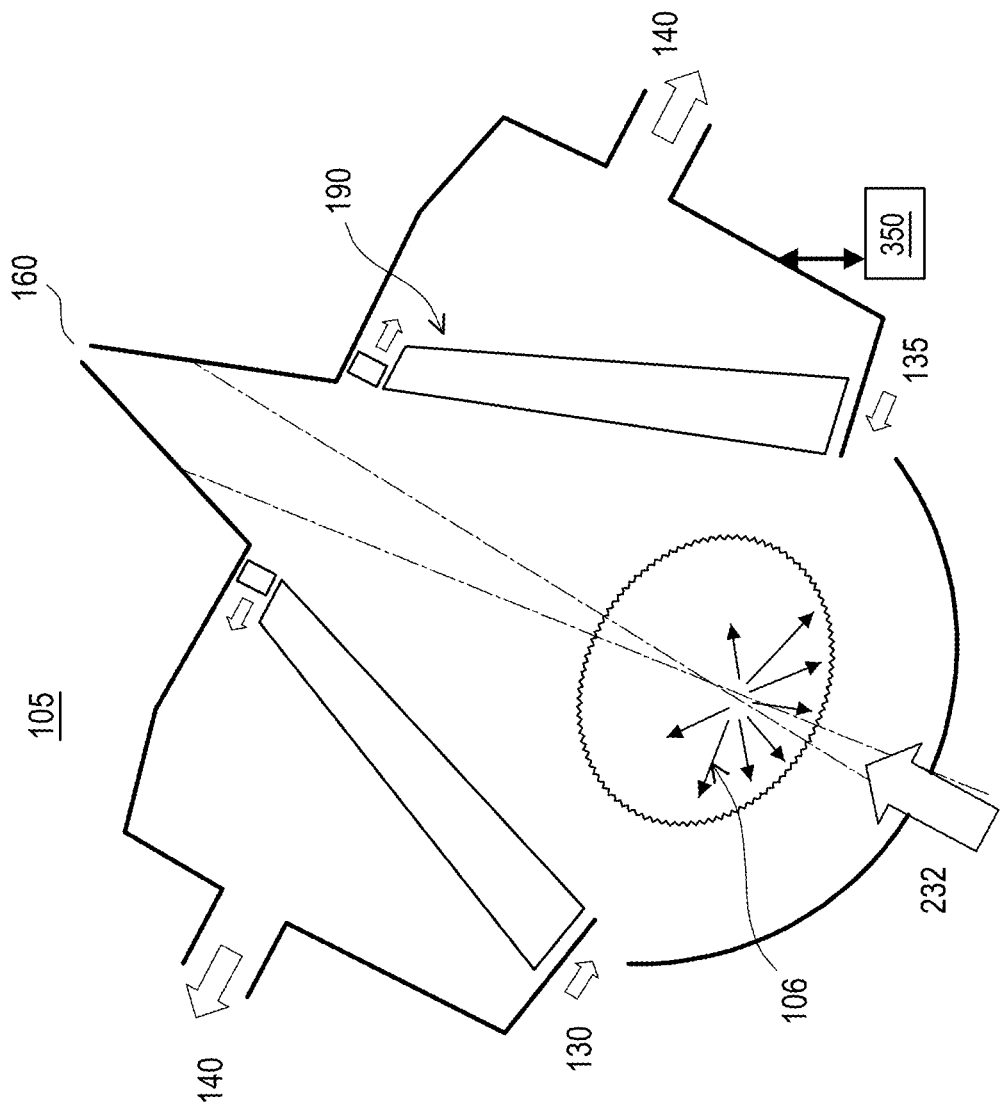

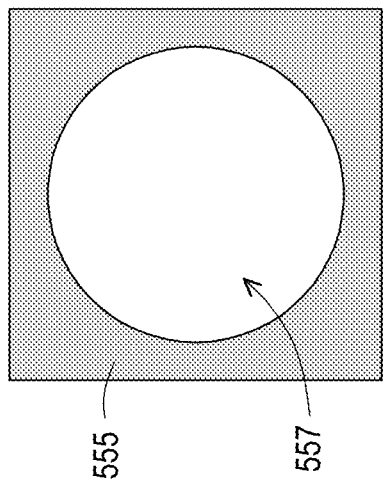
FIG. 4C
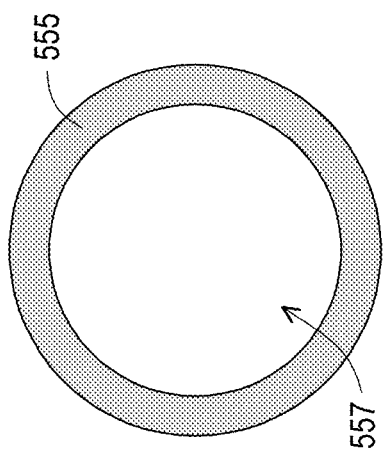
FIG. 4B
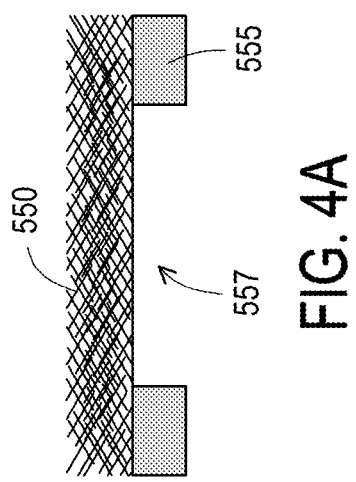
FIG. 4A
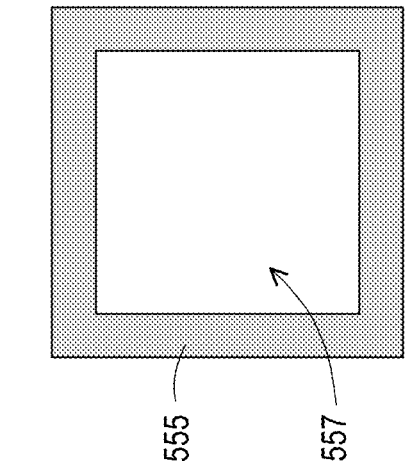
FIG. 4E
FIG. 4D

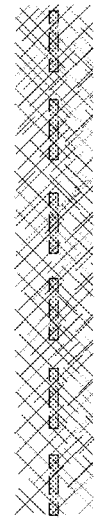 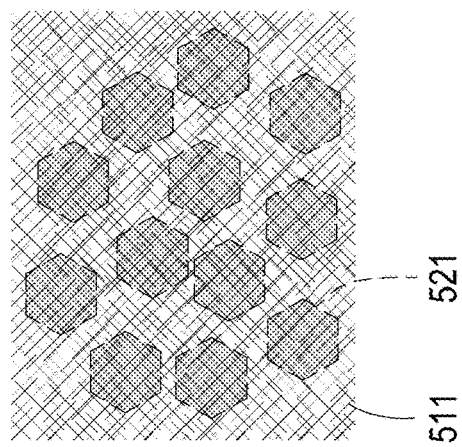
FIG. 6F
 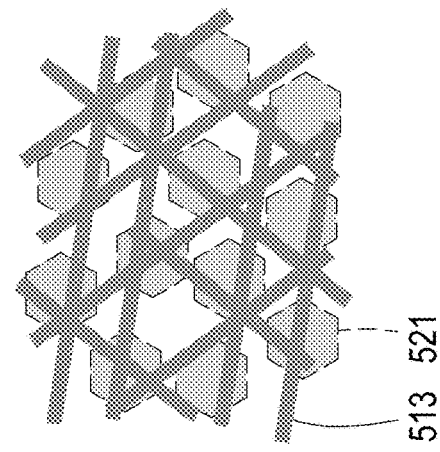
FIG. 6E
 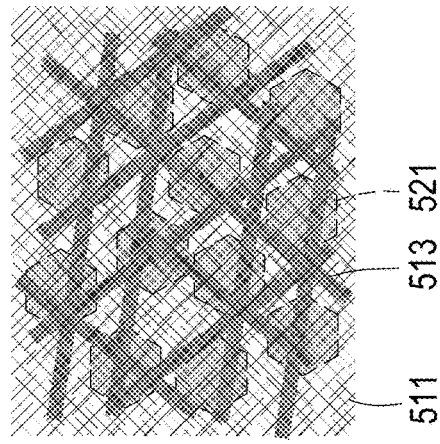
FIG. 6D
Side view
Top view

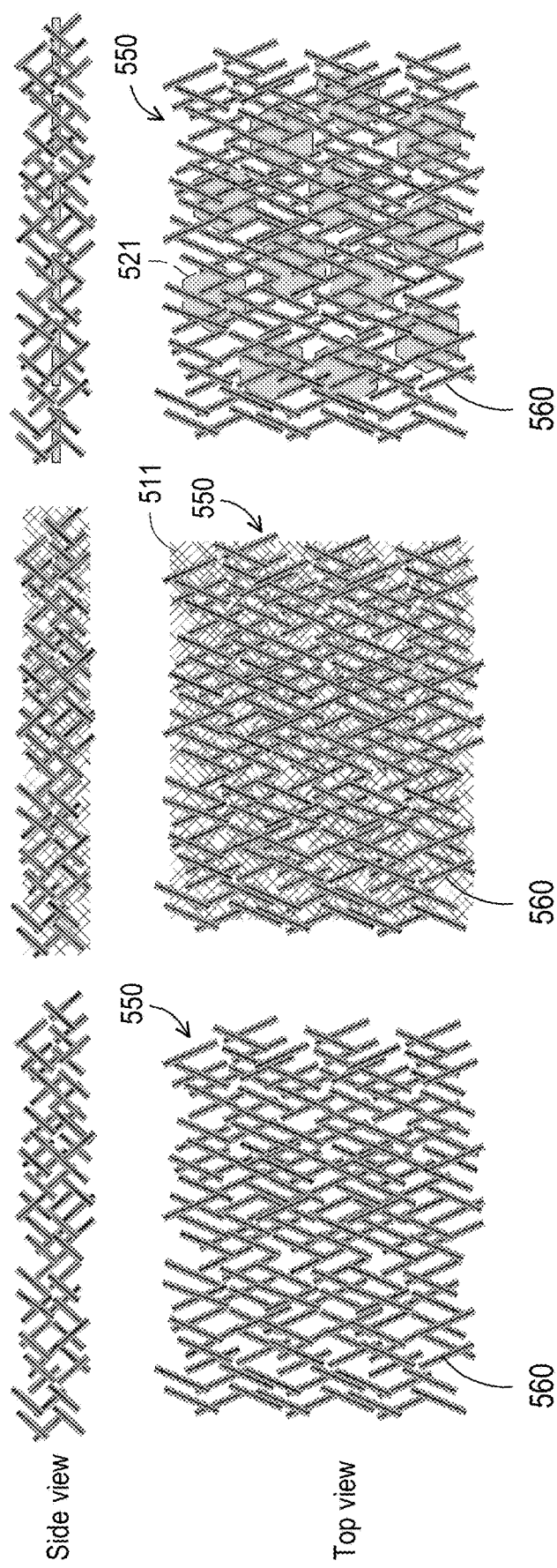

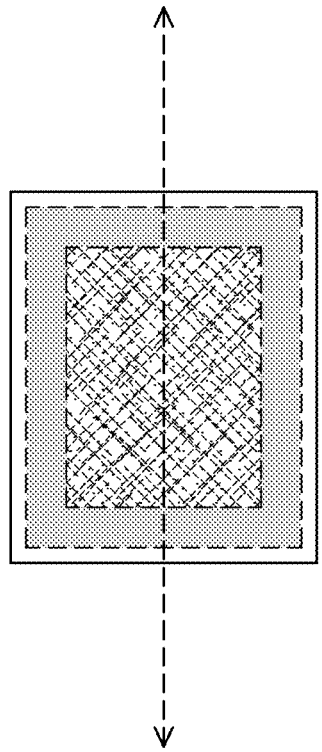
FIG. 19A
FIG. 19B
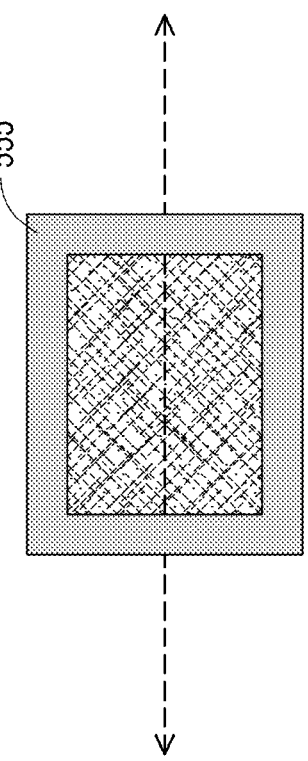
FIG. 18A
FIG. 18B

EUV LITHOGRAPHY APPARATUS AND OPERATING METHOD FOR MITIGATING CONTAMINATION

BACKGROUND

One growing technique for semiconductor manufacturing is extreme ultraviolet (EUV) lithography. EUV employs scanners using light in the EUV spectrum of electromagnetic radiation, including wavelengths from about one nanometer (nm) to about one hundred nm. Many EUV scanners still utilize projection printing, similar to various earlier optical scanners, except EUV scanners accomplish it with reflective rather than refractive optics, that is, with mirrors instead of lenses.

EUV lithography employs a laser-produced plasma (LPP), which emits EUV light. The LPP is produced by focusing a high-power laser beam, from a carbon dioxide ($CO_2$) laser and the like, onto small fuel droplet targets of tin (Sn) in order to transition it into a highly-ionized plasma state. This LPP emits EUV light with a peak maximum emission of about 13.5 nm or smaller. The EUV light is then collected by a collector and reflected by optics towards a lithography exposure object, such as a semiconductor wafer. Tin debris is generated in the process, which debris can adversely affect the performance and efficiency of the EUV apparatus.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1C is a diagram of laser and optics components in accordance with some embodiments.

FIGS. 4A, 4B, 4C, 4D and 4E show diagrams of a debris catcher in accordance with some embodiments of the present disclosure.

FIGS. 6A, 6B, 6C, 6D, 6E and 6F show various views of network membranes for a debris catcher in accordance with embodiments of the present disclosure.

FIGS. 8A, 8B and 8C show various views of network membranes for a debris catcher in accordance with embodiments of the present disclosure.

FIGS. 18A and 18B show a cross sectional view and a plan (top) view of one of the various stages for manufacturing a debris catcher in accordance with an embodiment of the present disclosure.

FIGS. 19A and 19B show a cross sectional view and a plan (top) view of one of the various stages for manufacturing a debris catcher in accordance with an embodiment of the present disclosure.

DETAILED DESCRIPTION

Figure 1A:
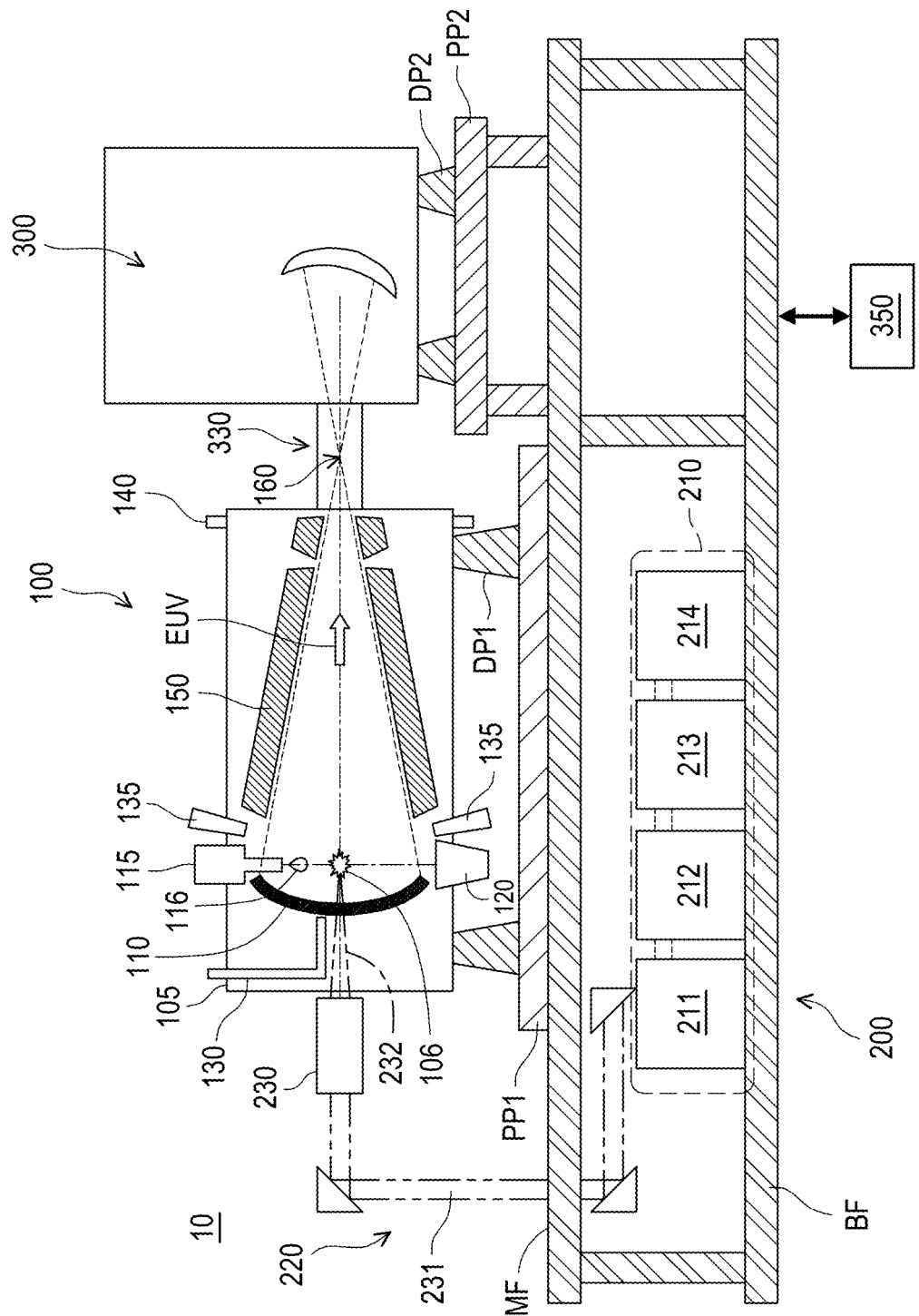
FIG. 1A is a diagram of a lithography apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One embodiment of the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform various lithography exposing processes. The lithography system may further include other modules or be integrated with (or be coupled with) other modules.

A lithography system is essentially a light projection system. Light is projected through a 'mask' or 'reticle' that constitutes a blueprint of the pattern that will be printed on a workpiece. The blueprint is four times larger than the intended pattern on the wafer or chip. With the pattern encoded in the light, the system's optics shrink and focus the pattern onto a photosensitive silicon wafer. After the pattern is printed, the system moves the wafer slightly and makes another copy on the wafer. This process is repeated until the wafer is covered in patterns, completing one layer of the eventual semiconductor device. To make an entire microchip, this process will be repeated one hundred times or more in some embodiments, laying patterns on top of patterns. The size of the features to be printed varies depending on the layer, which means that different types of lithography systems are used for different layers, from the latest-generation EUV systems for the smallest features to older deep ultraviolet (DUV) systems for the largest.

FIG. 1A is a schematic and diagrammatic view of an EUV lithography system 10. The EUV lithography system 10 includes an EUV radiation source apparatus 100 (sometimes referred to herein as a "source side" in reference to it or one or more of its relevant parts) to generate EUV light, an exposure tool 300, such as a scanner, and an excitation laser source apparatus 200. As shown in FIG. 1A, in some embodiments, the EUV radiation source apparatus 100 and the exposure tool 300 are installed on a main floor (MF) of a clean room, while the excitation laser source apparatus 200 is installed in a base floor (BF) located under the main floor. Each of the EUV radiation source apparatus 100 and the exposure tool 300 are placed over pedestal plates PP1 and PP2 via dampers DP1 and DP2, respectively. The EUV radiation source apparatus 100 and the exposure tool 300 are coupled to each other at a junction 330 by a coupling mechanism, which may include a focusing unit (not shown).

The EUV lithography system 10 is designed to expose a resist layer to EUV light (or EUV radiation). The resist layer is a material sensitive to the EUV light. The EUV lithography system 10 employs the EUV radiation source apparatus 100 to generate EUV light having a wavelength ranging between about 1 nanometer (nm) and about 100 nm. In one particular example, the EUV radiation source apparatus 100 generates EUV light with a wavelength centered at about 13.5 nm. In various embodiments, the EUV radiation source apparatus 100 utilizes LPP to generate the EUV radiation.

As shown in FIG. 1A, the EUV radiation source apparatus 100 includes a target droplet generator 115 and an LPP collector 110, enclosed by a chamber 105. The target droplet generator 115 generates a plurality of target droplets 116. In some embodiments, the target droplets 116 are tin (Sn) droplets. In some embodiments, the target droplets 116 have a diameter of about 30 microns (μm). In some embodiments, the target droplets 116 are generated at a rate about fifty droplets per second and are introduced into an excitation zone 106 at a speed of about seventy meters per second (m/s or mps). Other material can also be used for the target droplets 116, for example, a liquid material such as a eutectic alloy containing Sn and lithium (Li).

As the target droplets 116 move through the excitation zone 106, pre-pulses (not shown) of the laser light first heat the target droplets 116 and transform them into lower-density target plumes. Then, the main pulse 232 of laser light is directed through windows or lenses (not shown) into the excitation zone 106 to transform the target plumes into a LPP. The windows or lenses are composed of a suitable material substantially transparent to the pre-pulses and the main pulse 232 of the laser. The generation of the pre-pulses and the main pulse 232 is synchronized with the generation of the target droplets 116. In various embodiments, the pre-heat laser pulses have a spot size about 100 µm or less, and the main laser pulses have a spot size about 200-300 µm. A delay between the pre-pulse and the main pulse 232 is controlled to allow the target plume to form and to expand to an optimal size and geometry. When the main pulse 232 heats the target plume, a high-temperature LPP is generated. The LPP emits EUV radiation, which is collected by one or more mirrors of the LPP collector 110. More particularly, the LPP collector 110 has a reflection surface that reflects and focuses the EUV radiation for the lithography exposing processes. In some embodiments, a droplet catcher 120 is installed opposite the target droplet generator 115. The droplet catcher 120 is used for catching excess target droplets 116 for example, when one or more target droplets 116 are purposely or otherwise missed by the pre-pulses or main pulse 232.

As shown the target droplet generator 115 generates tin droplets along a vertical axis. Each droplet is hit by a $CO_2$ laser pre-pulse (PP). The droplet will responsively change its shape into a "pancake" during travel along the axial direction. After a time duration (MP to PP delay time), the pancake is hit by a $CO_2$ laser main (MP) proximate to a primary focus (PF) in order to generate an EUV light pulse. The EUV light pulse is then collected by an LPP collector 100 and delivered to the scanner side for use in wafer exposure.

The LPP collector 110 includes a proper coating material and shape to function as a mirror for EUV collection, reflection, and focusing. In some embodiments, the LPP collector 110 is designed to have an ellipsoidal geometry. In some embodiments, the coating material of the collector 100 is similar to the reflective multilayer of an EUV mask. In some examples, the coating material of the LPP collector 110 includes multiple layers, such as a plurality of molybdenum/silicon (Mo/Si) film pairs, and may further include a capping layer (such as ruthenium (Ru)) coated on the multiple layers to substantially reflect the EUV light.

The main pulse 232 is generated by the excitation laser source apparatus 200. In some embodiments, the excitation laser source apparatus 200 includes a pre-heat laser and a main laser. The pre-heat laser generates the pre-pulse that is used to heat or pre-heat the target droplet 116 in order to create a low-density target plume, which is subsequently heated (or reheated) by the main pulse 232, thereby generating increased emission of EUV light.

The excitation laser source apparatus 200 may include a laser generator 210, laser guide optics 220 and a focusing apparatus 230. In some embodiments, the laser generator 210 includes a carbon dioxide ($CO_2$) laser source or a neodymium-doped yttrium aluminum garnet (Nd:YAG) laser source. The laser light 231 generated by the laser generator 210 is guided by the laser guide optics 220 and focused into the main pulse 232 of the excitation laser by the focusing apparatus 230, and then introduced into the EUV radiation source apparatus 100 through one or more apertures, such as the aforementioned windows or lenses, In such an EUV radiation source apparatus 100, the LPP generated by the main pulse 232 creates physical debris, such as ions, gases and atoms of the droplet 116, along with the desired EUV light. In operation of the lithography system 10, there is an accumulation of such debris on the LPP collector 110, and such physical debris exits the chamber 105 and enters the exposure tool 300 (i.e., the "scanner side") as well as the excitation laser source apparatus 200.

In various embodiments, a buffer gas is supplied from a first buffer gas supply 130 through the aperture in the LPP collector 110 by which the main pulse 232 of laser light is delivered to the tin droplets 116. In some embodiments, the buffer gas is hydrogen ($H_2$), helium (He), argon (Ar), nitrogen ($N_2$), or another inert gas. In certain embodiments, $H_2$ is used, since H radicals generated by ionization of the buffer gas can also be used for cleaning purposes. Furthermore, $H_2$ absorbs the least amount of EUV light produced by the source side, and thus absorbs the least light used by the semiconductor manufacturing operations performed in the scanner side of the lithography apparatus 10. The buffer gas can also be provided through one or more second buffer gas supplies 135 toward the LPP collector 110 and/or around the edges of the LPP collector 110. Further, and as described in more detail later below, the chamber 105 includes one or more gas outlets 140 so that the buffer gas is exhausted outside the chamber 105.

Hydrogen gas has low absorption of the EUV radiation. Hydrogen gas reaching to the coating surface of the LPP collector 110 reacts chemically with a metal of the target droplet 116, thus forming a hydride, e.g., metal hydride. When Sn is used as the target droplet 116, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the Sn debris and $SnH_4$ from entering the exposure tool 300 and the excitation laser source apparatus 200. To trap the Sn, $SnH_4$ or other debris, one or more debris collection mechanisms or devices 150 are employed in the chamber 105. In various embodiments, a controller 350 controls the EUV lithography system 10 and/or one or more of its components shown in and described above with respect to FIG. 1A.

A large amount of Sn debris at high speed will be generated during EUV exposure. Most of the Sn debris will be carried out by a scrubber in conjunction with a high density $H_2$ flow. However, a portion of the Sn particles will evade the $H_2$ flow protection and reach the interface between source and scanner chambers. Then, Sn particles will be accelerated by a large pressure delta toward the reticle in various embodiments.

Figure 1B:
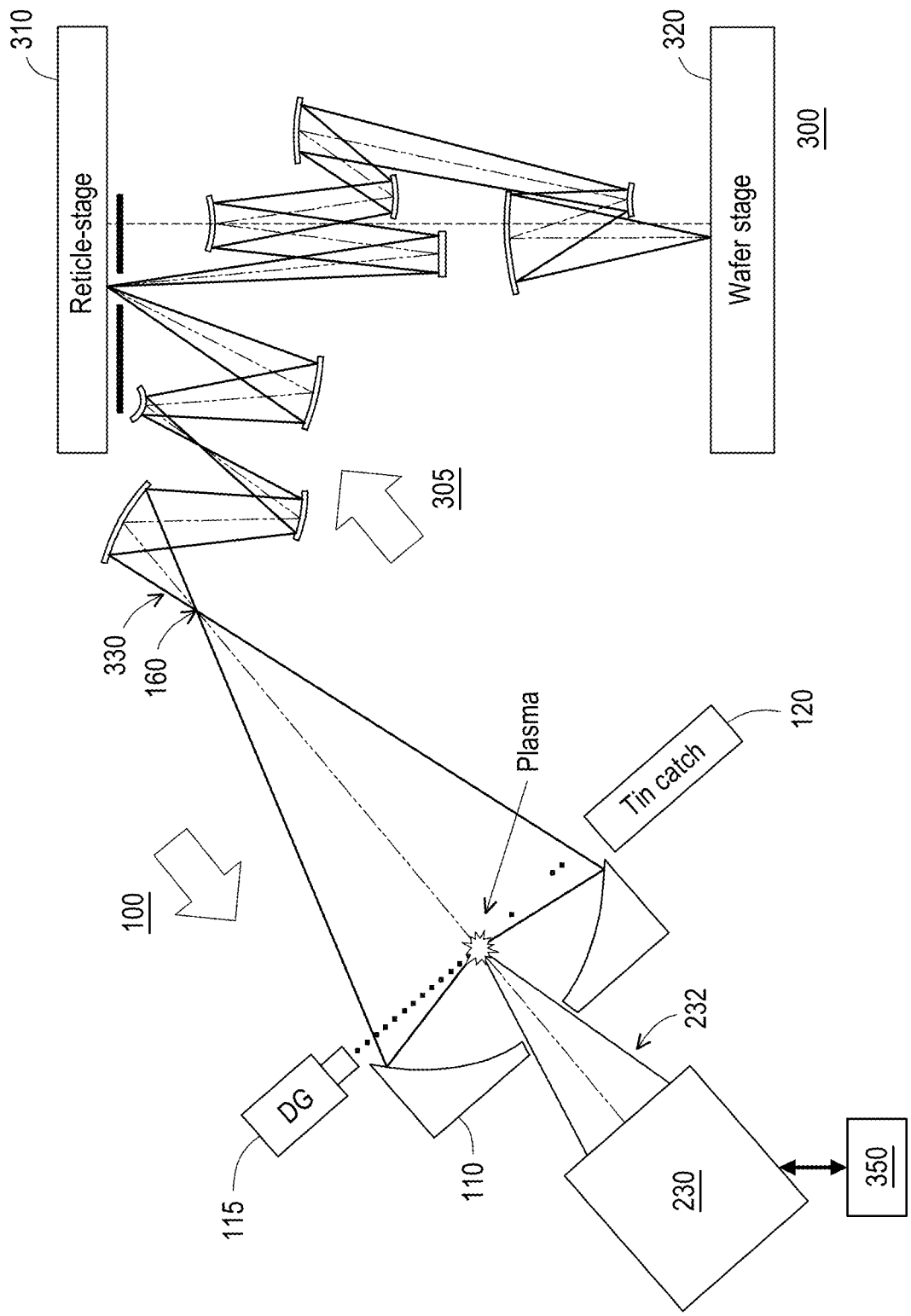
FIG. 1B is a diagram of a source side and a scanner side in accordance with some embodiments.

As shown in FIG. 1B, the exposure tool 300 (sometimes referred to herein as the "scanner side" in reference to it or one or more of its relevant parts) includes various reflective optic components, such as convex/concave/flat mirrors, a mask holding mechanism 310 including a mask stage (i.e., a reticle stage), and wafer holding mechanism 320. The EUV radiation generated by the EUV radiation source apparatus 100 and focused at intermediate focus 160 is guided by the reflective optical components 305 onto a mask (not shown) secured on the reticle stage 310, also referenced as a mask stage herein. In some embodiments, the distance from the intermediate focus 160 and the reticle disposed in the scanner side is approximately 2 meters. In some embodiments, a lower cone is provided at or near the intermediate focus 160 so that the EUV light pass through an inlet opening and an outlet opening of the cone.

In some embodiments, the reticle size is approximately 152 mm by 152 mm. In some embodiments, the reticle stage 310 includes an electrostatic chuck, or 'e-chuck,' (not shown) to secure the mask. The EUV light patterned by the mask is used to process a wafer supported on wafer stage 320. Because gas molecules absorb EUV light, the chambers and areas of the lithography system 10 used for EUV lithography patterning are maintained in a vacuum or a low-pressure environment to avoid EUV intensity loss. In various embodiments, the controller 350 controls one or more of the components of the EUV lithography system 10 as shown in and described with respect to FIG. 1B.

FIG. 1C shows further detail of the chamber 105 of the EUV radiation source apparatus 100, in which the relation of the LPP collector 110, the buffer gas supply 130, the second buffer gas supply 135, the gas outlet ports 140 and the intermediate focus 160 are illustrated. The main pulse 232 of the laser light is directed through the LPP collector 110 to the excitation zone 106 where it irradiates a target plume to form an LPP. The LPP emits EUV light that is collected by the LPP collector 110 and then directed through the intermediate focus 160 toward the exposure tool 300 for use in patterning a wafer as described previously. In various embodiments, the controller 350 controls one or more of the components of the EUV lithography system 10 as shown in and described with respect to FIG. 1C.

In various embodiments of the EUV lithography system 10, pressure in the LPP source side is higher than pressure in the scanner side. This is because the source side uses hydrogen gas to force the removal of airborne Sn debris therefrom, while the scanner side is maintained in near vacuum in order to avoid diminishing strength of the EUV light (being absorbed by air molecules) or otherwise interfering with the semiconductor manufacturing operations performed therein. In various embodiments, the intermediate focus 160 is disposed at a junction 330 or intersection of the source side and the scanner side.

As EUV light or radiation is generated, at least 50% of the mass of each tin droplet used to form the LPP does not vaporize, but instead becomes numerous tin nanoparticles ranging in diameter from 30 nm to 100 nm. Detrimentally, the nanoparticles also flow from the source side to scanner side through the intermediate focus 160 in the same general direction as the light generated by the source side. In some embodiments, tin debris form gaseous $SnH_x$, which flows into the scanner side and may reduced to Sn at some surfaces of the scanner.

Embodiments of the present disclosure prevent tin debris (e.g., nanoparticles and/or gaseous $SnH_x$) from flying into the scanner from the LPP radiation source by using a debris catcher which has a high EUV transmittance, e.g., more than about 92.5%.

Figure 2:
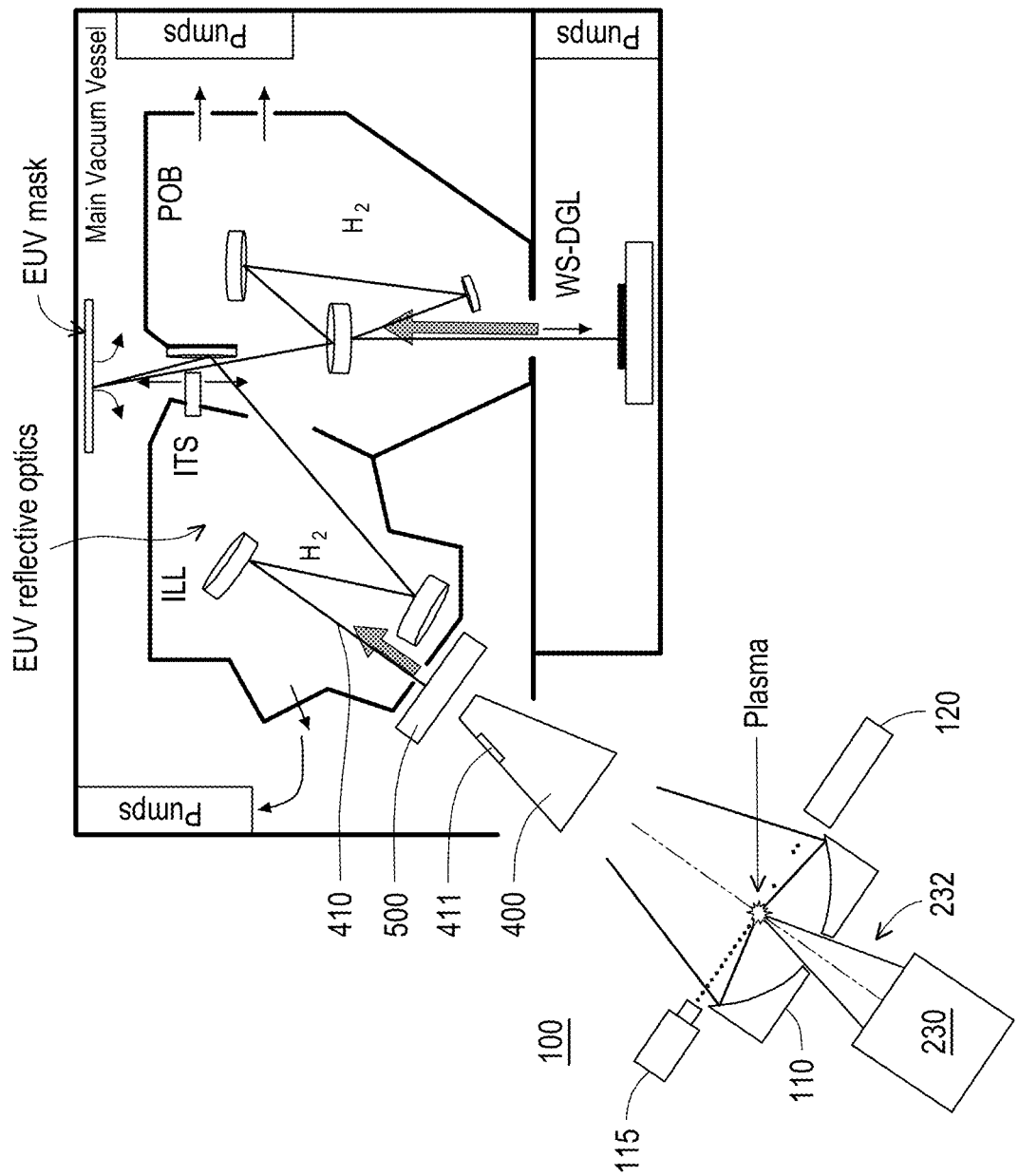
FIG. 2 is a diagram of a lithography apparatus in accordance with some embodiments of the present disclosure.

FIG. 2 is a diagram of an EUV lithography system in accordance with some embodiments. As shown in FIG. 2, a debris catcher 500 is disposed between the outlet opening of the lower cone (intermediate focus cone) 400 of the LPP radiation source and an entrance opening 410 of the EUV optics chamber of the scanner. The debris catcher 500 is configured to collect tin debris generated in the LPP radiation source and/or to prevent the tin debris from flowing into the scanner.

In some embodiments, a distance between the outlet opening of the cone 400 and the debris catcher 500 is in a range from about 1 mm to about 2 cm, and a distance between the debris catcher and the entrance opening 410 of the EUV optics chamber is in a range from about 1 mm to about 2 cm.

In some embodiments, the debris catcher 500 includes a network membrane including a plurality of fibers as explained below. In some embodiments, an EUV transmittance of the network membrane is more than about 95%.

Figure 3B:
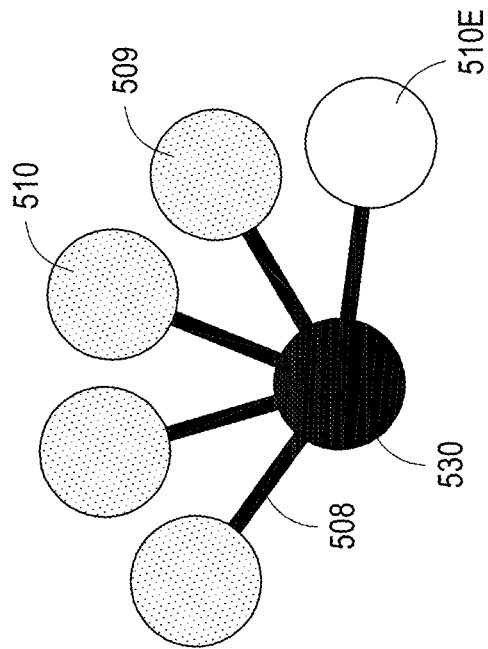
FIGS. 3A, 3B and 3C show diagrams of a debris catcher in accordance with some embodiments of the present disclosure.
Figure 3A:
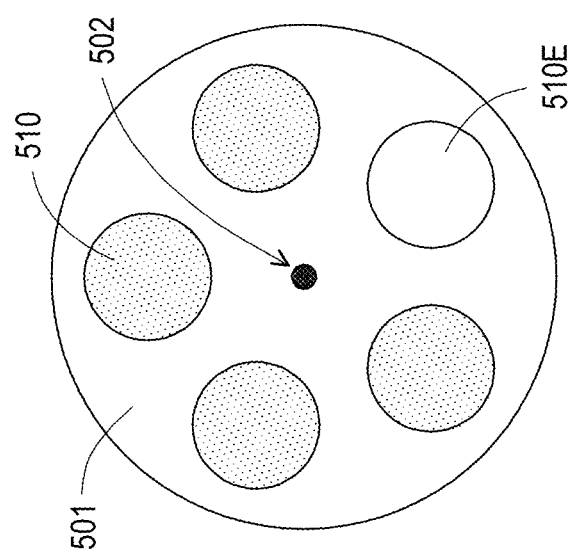
Figure 3C:
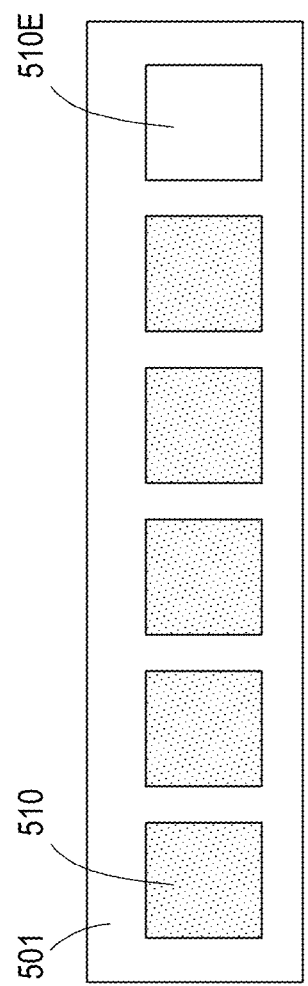

FIGS. 3A, 3B and 3C show diagrams of a debris catcher in accordance with some embodiments of the present disclosure.

In some embodiments, the debris catcher 500 is a revolver type having multiple slots as shown in FIG. 3A. A revolver plate 501 is configured to rotate around the rotational axis 502 to switch from one slot to another slot by using a motor or any other suitable rotational mechanism. One or more of the slots have a network membrane 510 fully covering the opening of the slot. Each slot corresponds to the opening of the outlet port of the cone 400. In some embodiments, a size of the slot and/or the network membrane is greater than the size of the opening of the outlet port of the cone 400 and the entrance opening 410 of the optics chamber. In some embodiments, the diameter of the slot or the network membrane 510 is in a range from about 2 cm to about 5 cm. In some embodiments, at least one slot 510E has no membrane and thus is a through opening. In some embodiments, the number of the slots 521 is 3, 4, 5, 6, 7 or 8 or any number from 9-16.

In some embodiments, the debris catcher 500 is a fan-shaped switcher as shown in FIG. 3B. In some embodiments, one or more network membranes 510 each supported by a frame 509 are attached to the center rotational mechanism 530 via an arm 508. In some embodiments, the debris catcher 500 includes at least one open frame having no membrane (i.e., a through opening 510E), as shown in FIG. 3B. In some embodiments, the number of the frames is 3, 4, 5, 6, 7 or 8 or any number from 9-16. The rotational mechanism 530 includes a motor and one or more gears to rotate the arms around the rotational axis in a step-by-step manner. In some embodiments, a size of the frame 509 and/or the network membrane 510 is greater than the size of the opening of the outlet port of the cone 400 and the entrance opening 410 of the optics chamber. In some embodiments, the diameter of the frame or the network membrane is in a range from about 2 cm to about 5 cm.

In some embodiments, the debris catcher 500 has a rectangular plate (tape) shape having one or more slots as shown in FIG. 3C. The rectangular plate 501 is configured to slide along its longitudinal direction to switch one slot to another slot by using a motor or any other suitable sliding mechanism. One or more of the slots have a network membrane 510 to fully cover the opening of the slot. Each slot corresponds to the opening of the outlet port of the cone 400. In some embodiments, a size of the slot and/or the network membrane is greater than the size of the opening of the outlet port of the cone 400 and the entrance opening of the optics chamber. In some embodiments, when the slot is circular, the diameter of the slot or the network membrane is in a range from about 2 cm to about 5 cm. In some embodiments, when the slot is rectangular (square), the sides of the slot or the network membrane is in a range from about 2 cm to about 5 cm. In some embodiments, at least one slot has no membrane, and thus, is a through opening. In some embodiments, the number of the slots is 3, 4, 5, 6, 7 or 8 or any number from 9-16.

In some embodiments, the debris catcher 500 is configured to switch from one slot or frame having the network membrane to another slot or frame having the network membrane according to a switching signal from a controller 350 (see, FIG. 1A). In some embodiments, when the EUV transmittance is or is estimated to be less than about 90%, the switching of the network membrane is performed. In some embodiments, the switching signal is provided periodically, for example, every day, week or month, which may indicate EUV transmission degradation. In other embodiments, the switching signal is provided every certain number of pulses of the excitation laser, which may indicate EUV transmission degradation. In some embodiments, the switching signal is provided when an intensity of the EUV radiation in the scanner side (or in the LPP radiation side) decreases below a threshold. In some embodiments, a weight monitor 411 (see, FIG. 2) is provided inside or near the lower cone 400 to monitor a weight of the accumulated Sn, and when the amount of Sn exceeds a threshold, which may indicate EUV transmission degradation, the switching signal is provided.

FIG. 4A shows a cross sectional view of the network membrane 550. In some embodiments, a frame 555 is provided one or both sides of the network membrane. In some embodiments, the frame 555 corresponds to the frame 509 of FIG. 3B, or is a part of the revolver plate 501 of FIG. 3A and a plate 501 of FIG. 3C.

In some embodiments, the frame 555 is formed of one or more layers of crystalline silicon, polysilicon, silicon oxide, silicon nitride, a ceramic, a metal or an organic material (e.g., resin).

In some embodiments, the frame 555 has a circular opening 557 and a circular outer periphery as shown in FIG. 4B. In some embodiments, the frame 555 has a circular opening 557 and a rectangular (e.g., a square) outer periphery as shown in FIG. 4C. In some embodiments, the frame 555 has a rectangular (e.g., square) opening 557 and a rectangular (e.g., square) outer periphery as shown in FIG. 4D. In some embodiments, the frame 555 has a rectangular (e.g., square) opening 557 and a circular outer periphery as shown in FIG. 4E. The network membrane 550 has a circular shape, a rectangular (e.g., square) shape or any other polygonal shape and is disposed over the frame 555 to fully cover the opening 557.

Figure 5A:
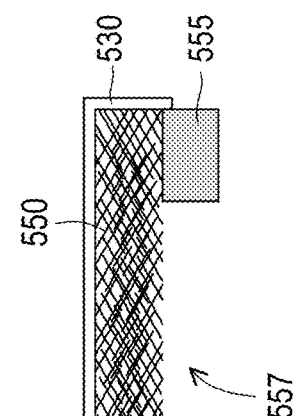
FIGS. 5A, 5B, 5C, 5D and 5E show diagrams of a debris catcher in accordance with some embodiments of the present disclosure.
Figure 5B:
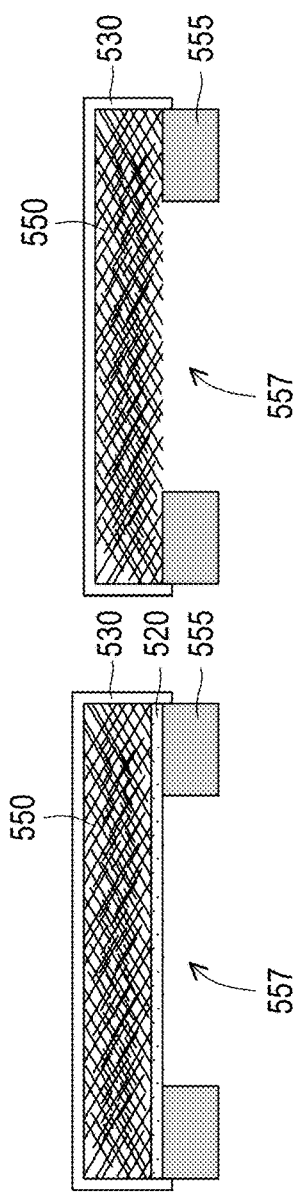
Figure 5C:
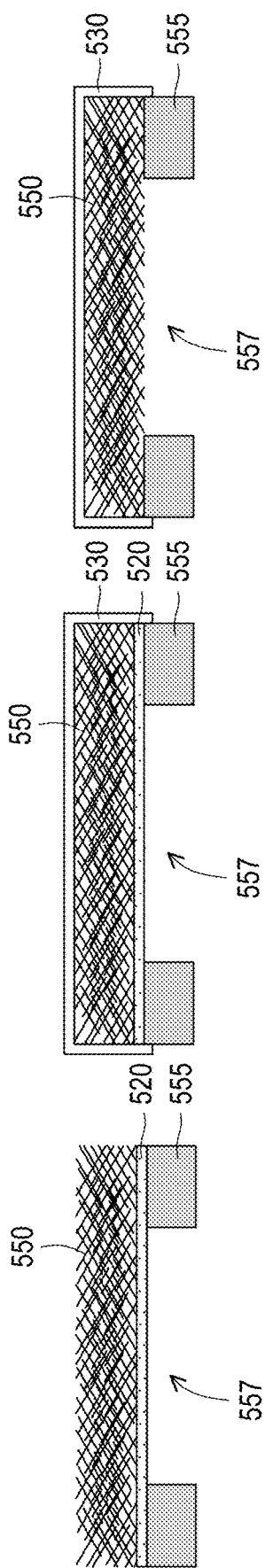
Figure 5D:
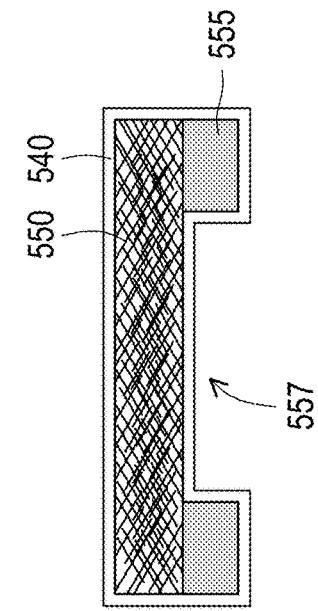
Figure 5E:
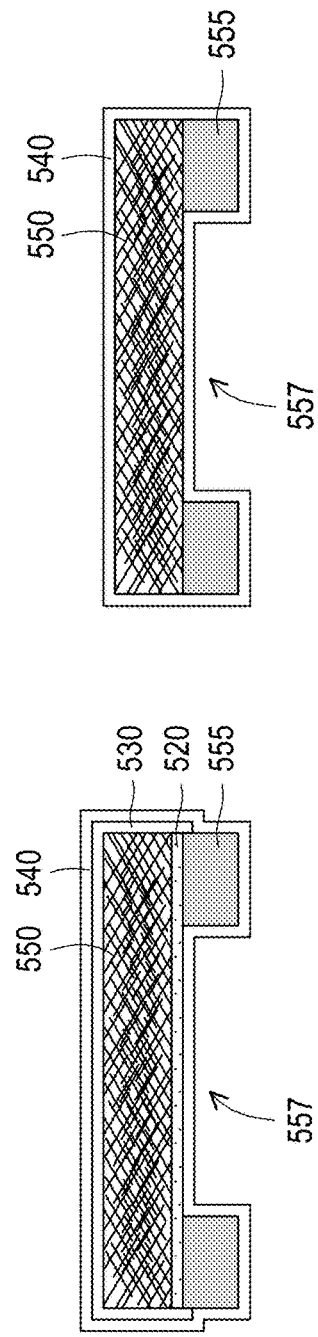

In some embodiments, a first cover sheet (or layer) 520 is formed at the bottom surface of the network membrane 550 between the frame 555 and the network membrane 550 as shown in FIG. 5A. In some embodiments, a second cover sheet 530 is formed over the network membrane 550 to seal the network membrane together with the first cover sheet 520, as shown in FIG. 5B. In some embodiments, no first cover sheet is used and only the second cover sheet 530 is used as show in FIG. 5C. In some embodiments, a third cover sheet 540 covers the entire structure of FIG. 5B (or FIG. 5A or 5C), as shown in FIG. 5D. In some embodiment, no first cover sheet and/or second cover sheet are used as shown in FIG. 5E. In some embodiments, the material of third cover sheet 540 of FIG. 5E is the same as the material of the first and/or second cover sheets.

In some embodiments, one of or both of the first cover layer 520 and the second cover layer 530 include a two-dimensional material in which one or more two-dimensional layers are stacked. Here, a "two-dimensional" layer refers to one or a few crystalline layers of an atomic matrix or a network having thickness within the range of about 0.1-5 nm, in some embodiments.

In some embodiments, the two-dimensional materials of the first cover layer 520 and the second cover layer 530 are the same or different from each other. In some embodiments, the first cover layer 520 includes a first two-dimensional material and the second cover layer 530 includes a second two-dimensional material.

In some embodiments, the two-dimensional material for the first cover layer 520 and/or the second cover layer 530 includes at least one of boron nitride (BN), graphene, and/or transition metal dichalcogenides (TMDs), represented by $MX_2$, where M=Mo, W, Pd, Pt, and/or Hf, and X=S, Se and/or Te. In some embodiments, a TMD is one of $MoS_2$, $MoSe_2$, $WS_2$ or $WSe_2$.

In some embodiments, a total thickness of each of the first cover layer 520 and the second cover layer 530 is in a range from about 0.3 nm to about 3 nm and is in a range from about 0.5 nm to about 1.5 nm in other embodiments. In some embodiments, a number of the two-dimensional layers of each of the two-dimensional materials of the first and/or second cover layers is 1 to about 20, and is 2 to about 10 in other embodiments. When the thickness and/or the number of layers is greater than these ranges, EUV transmittance of the debris catcher may be decreased and when the thickness and/or the number of layers is smaller than these ranges, mechanical strength of the debris catcher may be insufficient.

In some embodiments, a third cover layer 540 includes at least one layer of an oxide, such as $HfO_2$, $Al_2O_3$, $ZrO_2$, $Y_2O_3$, or $La_2O_3$. In some embodiments, the third cover layer 540 includes at least one layer of non-oxide compounds, such as $B_4C$, YN, $Si_3N_4$, BN, NbN, RuNb, $YF_3$, TiN, or ZrN. In some embodiments, the protection layer 40 includes at least one metal layer made of, for example, Ru, Nb, Y, Sc, Ni, Mo, W, Pt, or Bi. In some embodiments, the third cover layer 540 is a single layer, and in other embodiments, two or more layers of these materials are used as the protection layer 40. In some embodiments, a thickness of the protection layer is in a range from about 0.1 nm to about 5 nm, and is in a range from about 0.2 nm to about 2.0 nm in other embodiments. When the thickness of the third cover layer 540 is greater than these ranges, EUV transmittance of the debris catcher may be decreased and when the thickness of the third cover layer 540 is smaller than these ranges, the mechanical strength of the debris catcher may be insufficient.

In some embodiments, the thickness of the network membrane 550 is in a range from about 5 nm to about 100 nm, and is in a range from about 10 nm to about 50 nm in other embodiments. When the thickness of the network membrane 550 is greater than these ranges, EUV transmittance of the debris catcher may be decreased and when the thickness of the network membrane 550 is smaller than these ranges, the mechanical strength of the debris catcher may be insufficient.

FIGS. 6A, 6B, 6C, 6D, 6E and 6F show various views of network membranes for a debris catcher in accordance with embodiments of the present disclosure.

In some embodiments, the network membrane 550 includes a plurality of nanotubes. In some embodiments, the plurality of nanotubes are randomly arranged to form a network structure. In some embodiments, a diameter of each of the plurality of nanotubes is in a range from about 0.5 nm to about 20 nm and is in a range from about 1 nm to about 10 nm in other embodiments. In some embodiments, a length of each of the plurality of nanotubes is in a range from about 0.5 μm to about 50 μm and is in a range from about 1.0 μm to about 20 μm in other embodiments.

In some embodiments, the plurality of nanotubes are carbon nanotubes, boron nitride nanotubes, and/or TMD nanotubes, where TMD is represented by $MX_2$, where M=Mo, W, Pd, Pt, and/or Hf, and X=S, Se and/or Te. In some embodiments, the plurality of nanotubes are $MoS_2$ nanotubes, $MoSe_2$ nanotubes, $WS_2$ nanotubes or $WSe_2$ nanotubes.

In some embodiments, the plurality of nanotubes include only one type of nanotubes in terms of material and structure. In some embodiments, the plurality of nanotubes include nanotubes of the same material. In some embodiments, the network membrane 550 only includes single wall nanotubes 511 as shown in FIG. 6A. In other embodiments, the network membrane 550 only includes multiwall (e.g., double wall) nanotubes 513 as shown in FIG. 6B. A multiwall nanotube includes an inner tube and one or more outer tubes coaxially disposed around the inner tube. In some embodiments, the outer tube is movable along the axial direction with respect to the inner tube and in other embodiments, the outer tube is fixed on the outer surface of the inner tube. In some embodiments, a diameter of each of the single wall nanotubes is in a range from about 0.5 nm to about 5 nm and is in a range from about 1 nm to about 2 nm in other embodiments. In some embodiments, a diameter of each of the multiwall nanotubes is in a range from about 3 nm to about 20 nm and is in a range from about 5 nm to about 10 nm in other embodiments.

In some embodiments, the plurality of nanotubes include two or more types of nanotubes in terms of material and structure. In some embodiments, the plurality of nanotubes include single wall nanotubes made of two or more materials (mixture of different material nanotubes). For example, in some embodiments, the plurality of nanotubes include a plurality of first nanotubes and a plurality of second nanotubes made of different material from the plurality of first nanotubes, and both of them are single wall nanotubes.

Figure 6C:
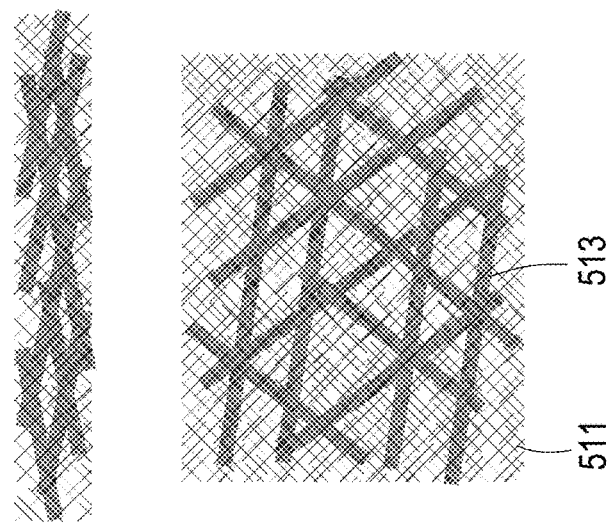
Figure 6B:
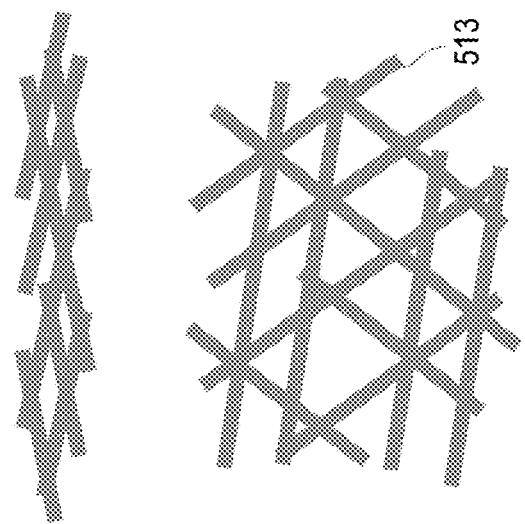
Figure 6A:
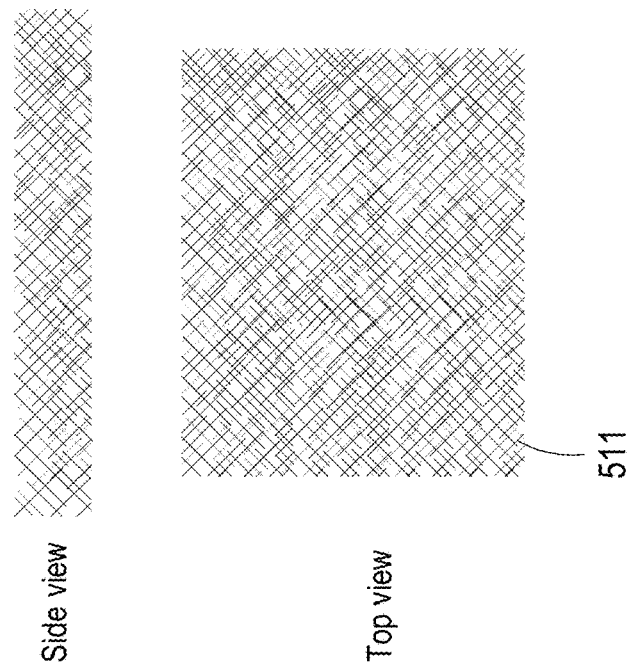

In some embodiments, the main network layer 550 includes a plurality of nanotubes 511 which are single wall nanotubes, and a plurality of nanotubes 513 which are multiwall (e.g., double wall) nanotubes as shown in FIG. 6C. In some embodiments, an amount (weight) of the single wall nanotubes 511 is greater than an amount of the multiwall nanotubes 513. In some embodiments, an amount (weight) of the single wall nanotubes 511 is greater than an amount of the multiwall nanotubes 513.

In some embodiments, the plurality of single wall nanotubes 511 are made of a same material as the plurality of multiwall nanotubes 513. For example, the plurality of single wall nanotubes 511 are single wall carbon nanotubes, and the plurality of multiwall nanotubes 513 are multiwall carbon nanotubes. In other embodiments, the plurality of single wall nanotubes 511 are made of a different material from the plurality of multiwall nanotubes 513. For example, the plurality of single wall nanotubes 511 are single wall TMD nanotubes, and the plurality of multiwall nanotubes 513 are multiwall carbon nanotubes. In some embodiments, the plurality of nanotubes are multiple nanotubes made of two or more different materials (mixture of two types of multiwall nanotubes).

In some embodiments, the main network membrane 550 includes a plurality of nanotubes 511 and a plurality of flakes 521 (nano-flakes) made of a two-dimensional material in which one or more two-dimensional layers are stacked, as shown in FIGS. 6D-6F.

In some embodiments, the two-dimensional material flakes 521 include at least one of boron nitride (BN), graphene, and/or transition metal dichalcogenides (TMDs), represented by $MX_2$, where M=Mo, W, Pd, Pt, and/or Hf, and X=S, Se and/or Te. In some embodiments, a TMD is one of $MoS_2$, $MoSe_2$, $WS_2$ or $WSe_2$.

In some embodiments, a thickness of two-dimensional material flakes 521 is in a range from about 0.3 nm to about 3 nm and is in a range from about 0.5 nm to about 1.5 nm in other embodiments. In some embodiments, a number of the two-dimensional layers of two-dimensional material flakes 521 is 1 to about 20, and is 2 to about 10 in other embodiments. When the thickness and/or the number of layers is greater than these ranges, EUV transmittance of the debris catcher may be decreased and when the thickness and/or the number of layers is smaller than these ranges, mechanical strength of the debris catcher may be insufficient.

In some embodiments, the shape of the two-dimensional material flakes 521 is random. In other embodiments, the shape of the two-dimensional material flakes 521 is triangular or hexagonal. In certain embodiments, the shape of the two-dimensional material flakes 521 is a triangle formed by three atoms or a hexagon formed by six atoms. In some embodiments, a size (area) of each of the two-dimensional material flakes 521 is in a range from about 10 $nm^2$ to about 10 $\mu m^2$ and is in a range from about 100 $nm^2$ to about 1 $\mu m^2$ in other embodiments.

In some embodiments, the two-dimensional material flakes 521 are embedded in or mixed with a plurality of single wall nanotubes 511 as shown in FIG. 6D. In some embodiments, the two-dimensional material flakes 521 are embedded in or mixed with a plurality of multiwall nanotubes 513 as shown in FIG. 6E. In some embodiments, the two-dimensional material flakes 521 are embedded in or mixed with a plurality of single wall nanotubes 511 and a plurality of multiwall nanotubes 513, as shown in FIG. 6F.

In some embodiments, an amount (weight) of the two-dimensional material flakes 521 is in a range from about 5% to about 30% with respect to a total weight of the network membrane 550, and is in a range from about 10% to about 20% in other embodiments. When the amount of two-dimensional material flakes is greater than these ranges, the EUV transmittance of the debris catcher may be decreased and when the amount of two-dimensional material flakes is smaller than these ranges, the mechanical strength of the debris catcher may be insufficient.

FIGS. 7A, 7B, 7C and 7D show various views of multiwall nanotubes in accordance with embodiments of the present disclosure of the present disclosure. In some embodiments, the multiwall nanotubes are also referred to as co-axial nanotubes.

Figure 7C:
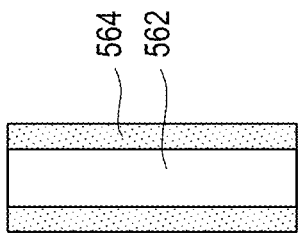
FIGS. 7A, 7B, 7C and 7D show various views of multi-wall nanotubes in accordance with embodiments of the present disclosure of the present disclosure.
Figure 7B:
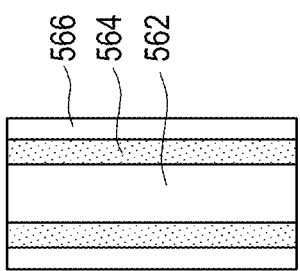
Figure 7D:
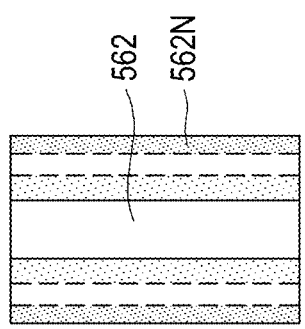
Figure 7A:
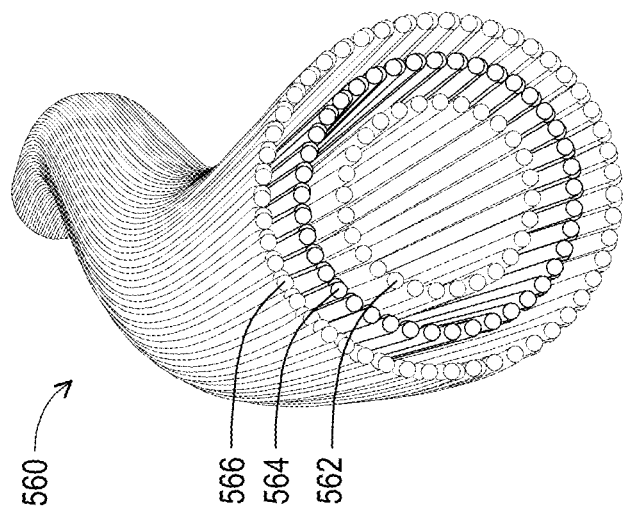

FIG. 7A shows a perspective view of a multiwall co-axial nanotube 560 having three tubes 562, 564 and 566 and FIG. 7B shows a cross sectional view thereof. In some embodiments, the inner tube 562 is a carbon nanotube, and two outer tubes 564 and 566 are boron nitride nanotubes.

The number of tubes of the multiwall nanotubes is not limited to three. In some embodiments, the multiwall nanotube has two co-axial nanotubes as shown in FIG. 7C, and in other embodiments, the multiwall nanotube includes the innermost tube 562 and the first to N-th nanotubes including the outermost tube 562N, where N is a natural number from 1 to about 20, as shown in FIG. 7D. In some embodiments, N is up to 10 or up to 5. In some embodiments, at least one of the first to the N-th outer layers is a nanotube coaxially surrounding the innermost nanotube 562. In some embodiments, two of the innermost nanotubes 562 and the first to the N-th outer layers 562, 564, . . . 562N are made of different materials from each other. In some embodiments, N is at least two (i.e., three or more tubes), and two of the innermost nanotubes 563 and the first to the N-th outer tubes 564, 566, . . . 562N are made of the same materials. In other embodiments, three of the innermost nanotubes 562 and the first to the N-th outer tubes 564, 566, . . . 562N are made of different materials from each other.

In some embodiments, each of the nanotubes of the multiwall nanotube is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te. In some embodiments, at least two of the tubes of the multiwall nanotube are made of different material from each other. In some embodiments, adjacent two layers (tubes) of the multiwall nanotube are made of different material from each other.

In some embodiments, the multiwall nanotube includes three co-axially layered tubes made of different materials from each other. In other embodiments, the multiwall nanotube includes three co-axially layered tubes, in which the innermost tube (first tube) and the second tube surrounding the innermost tube are made of different materials from each other, and the third tube surrounding the second tube is made of the same material as or different material from the innermost tube or the second tube.

In some embodiments, the multiwall nanotube includes four co-axially layered tubes each made of different materials A, B or C. In some embodiments, the materials of the four layers are from the innermost (first) tube to the fourth tube, A/B/A/A, AB/AB, AB/A/C, A/B/B/A, A/BBB, A/B/B/C, AB/C/A, A/B/C/B, or A/B/C/C.

In some embodiments, all the tubes of the multiwall nanotube are crystalline nanotubes. In other embodiments, one or more tubes are a non-crystalline (e.g., amorphous) layer wrapping around the one or more inner tubes. In some embodiments, the outermost tube is made of, for example, a layer of $HfO_2$, $Al_2O_3$, $ZrO_2$, $Y_2O_3$, $La_2O_3$, $B_4C$, YN, $Si_3N_4$, BN, NbN, RuNb, $YF_3$, TiN, ZrN, Ru, Nb, Y, Sc, Ni, Mo, W, Pt, or Bi. In some embodiments, the outermost layer is made of the same material as the third cover layer 540.

In some embodiments, a diameter of the innermost nanotube is in a range from about 0.5 nm to about 20 nm and is in a range from about 1 nm to about 10 nm in other embodiments. In some embodiments, a diameter of the multiwall nanotubes (i.e., diameter of the outermost tube) is in a range from about 3 nm to about 40 nm and is in a range from about 5 nm to about 20 nm in other embodiments. In some embodiments, a length of the multiwall nanotube is in a range from about 0.5 μm to about 50 μm and is in a range from about 1.0 μm to about 20 μm in other embodiments.

FIGS. 8A, 8B and 8C show various views of network membranes for a debris catcher in accordance with embodiments of the present disclosure.

In some embodiments, the network membrane 550 includes a plurality of multiwall nanotubes 560. In some embodiments, the plurality of multiwall nanotubes are randomly arranged to form a network structure. In some embodiments, the plurality of multiwall nanotubes include only one type of multiwall nanotubes in terms of material and structure (number of layers). In other embodiments, the plurality of multiwall nanotubes include two or more types of multiwall nanotubes in terms of material and structure (number of layers). For example, the plurality of multiwall nanotubes include a first type of multiwall nanotubes, e.g., two wall nanotubes, and a second type of multiwall nanotubes, e.g., three wall nanotubes; a first type of multiwall nanotubes, e.g., two wall nanotubes of layer A and layer B, and a second type of multiwall nanotubes, e.g., two wall nanotubes of layer A and layer C.

In some embodiments, the main network layer 550 includes a plurality of one or more types of multiwall nanotubes 560, and a plurality of one or more types of single wall nanotubes 511, as shown in FIG. 8B. In some embodiments, an amount (weight) of the single wall nanotubes 511 is smaller than an amount of the multiwall nanotubes 560. In some embodiments, an amount (weight) of the single wall nanotubes 511 is greater than an amount of the multiwall nanotubes 560. In some embodiments, the amount (weight) of the multiwall nanotubes 560 is at least about 20 wt % with respect to a total weight of the network membrane 550, or is at least 40 wt % in other embodiments. When the amount of the multiwall nanotubes is smaller than these ranges, sufficient strength of the network membrane may not be obtained.

In some embodiments, the main network membrane 550 includes a plurality of multiwall nanotubes 560 and a plurality of flakes 521 (nano-flakes) made of a two-dimensional material in which one or more two-dimensional layers are stacked, as shown in FIG. 8C. In some embodiments, an amount (weight) of the two-dimensional material flakes 521 is in a range from about 5 wt % to about 30 wt % with respect to a total weight of the network membrane 100, and is in a range from about 10 wt % to about 20 wt % in other embodiments.

Figure 9A:
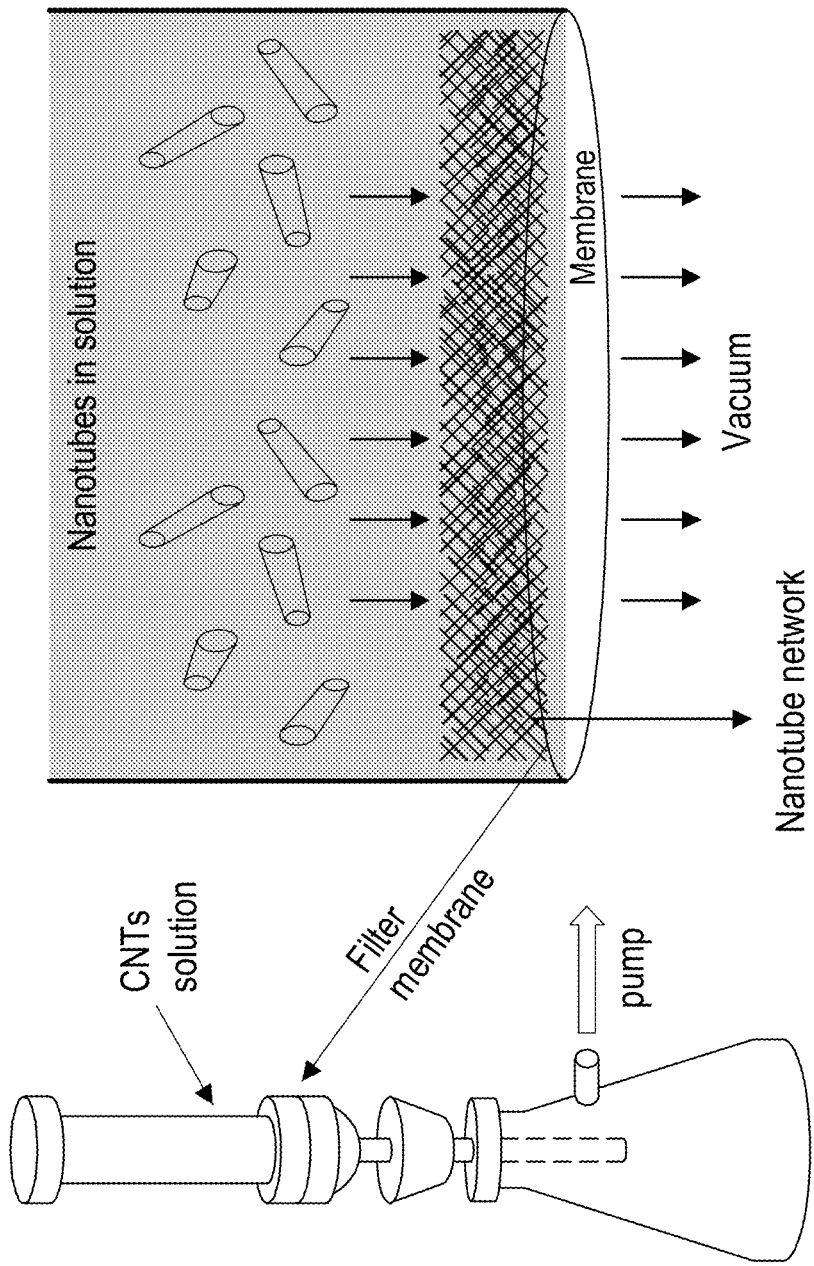
FIG. 9A shows a manufacturing process of a network membrane.
Figure 9B:
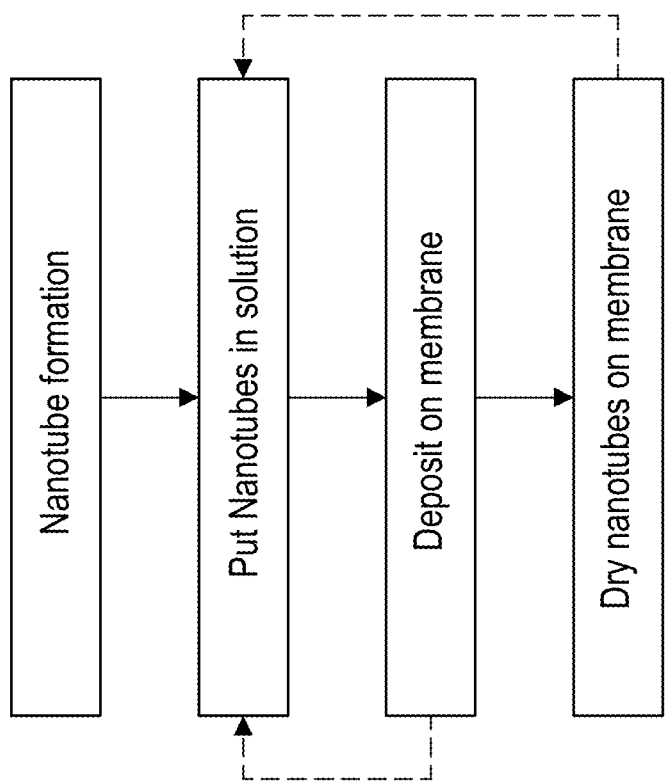
FIG. 9B shows a flow chart thereof and FIG. 9C show manufacturing processes of a network membrane in accordance with an embodiment of the present disclosure.
Figure 9C:
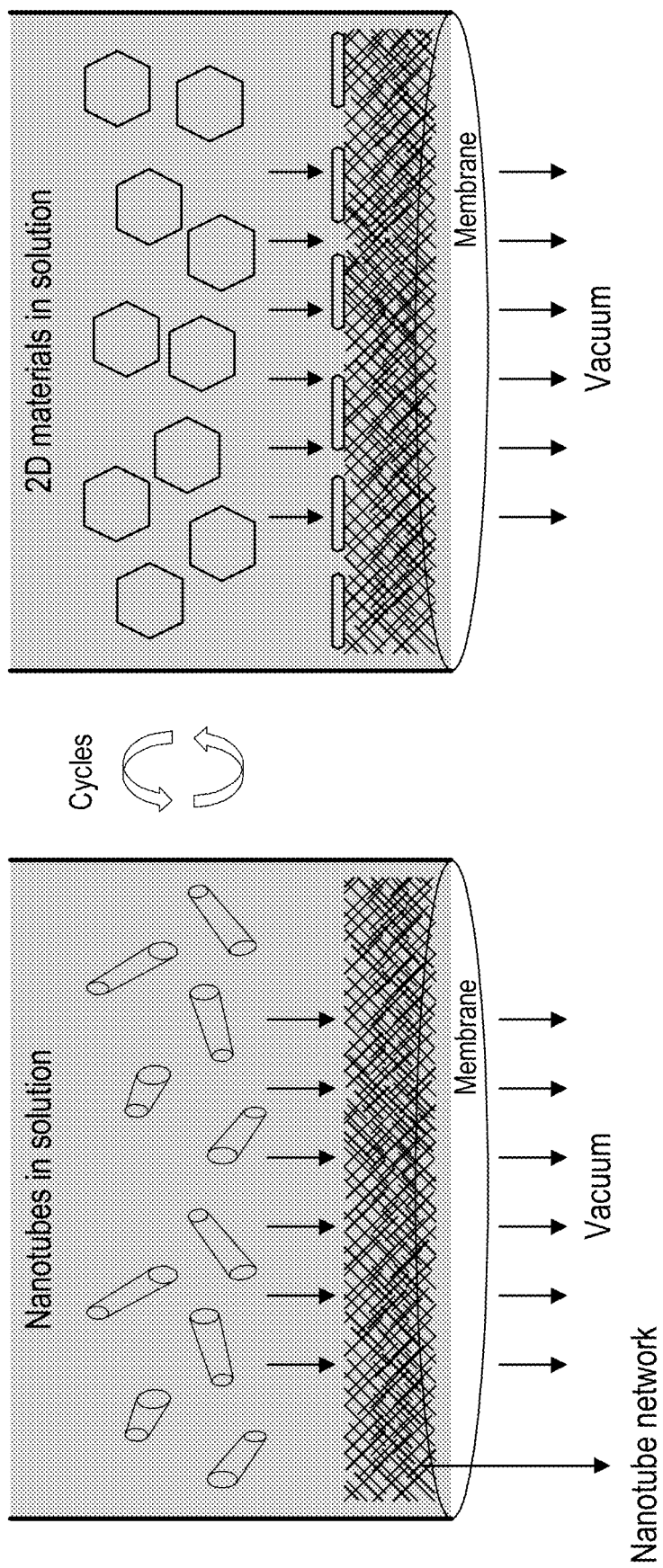

FIG. 9A shows a manufacturing process of a network membrane, FIG. 9B shows a flow chart thereof and FIG. 9C show manufacturing processes of a network membrane in accordance with an embodiment of the present disclosure.

In some embodiments, nanotubes are dispersed in a solution as shown in FIG. 9A. In some embodiments, the solution includes a solvent, such as water, and a surfactant, such as sodium dodecyl sulfate (SDS). The nanotubes are one type or two or more types of nanotubes (material and/or wall numbers). In some embodiments, the nanotubes are single wall nanotubes. In some embodiments, single wall nanotubes are carbon nanotubes formed by various methods, such as arc-discharge, laser ablation or chemical vapor deposition (CVD) methods. Similarly, single wall BN nanotubes and single wall TMD nanotubes are also formed by a CVD process.

As shown in FIG. 9A, a support membrane is placed between a chamber or a cylinder in which the nanotube dispersed solution is disposed and a vacuum chamber. In some embodiments, the support membrane is an organic or inorganic porous or mesh material. In some embodiments, the support membrane is woven or non-woven fabric. In some embodiments, the support membrane has a circular shape.

As shown in FIG. 9A, the pressure in the vacuum chamber is reduced so that a pressure is applied to the solvent in the chamber or cylinder. Since the mesh or pore size of the support membrane is sufficiently smaller than the size of the nanotubes, the nanotubes are captured by the support membrane while the solvent passes through the support membrane. The support membrane on which the nanotubes are deposited is detached from the filtration apparatus of FIG. 9A and then is dried. In some embodiments, the deposition by filtration is repeated so as to obtain a desired thickness of the nanotube network layer as shown in FIG. 9B. In some embodiments, after the deposition of the nanotubes in the solution, other nanotubes are dispersed in the same or new solution and the filter-deposition is repeated. In other embodiments, after the nanotubes are dried, another filter-deposition is performed. In the repetition, the same type of nanotubes is used in some embodiments, and different types of nanotubes are used in other embodiments.

In some embodiments, the nanotubes dispersed in the solution include multiwall nanotubes. In some embodiments, multiwall nanotubes are formed by CVD by using single wall nanotubes as seeds. In some embodiments, single wall nanotubes, such as carbon nanotubes, BN nanotubes or TMD nanotubes formed by CVD are placed over a substrate. Then, source materials, such as source gases, are provided over the substrate with the seed nanotubes. In a case of CVD for forming a $MoS_2$ layer, a $Mo(CO)_6$ gas, a $MoCl_5$ gas, and/or a MoOCl$_4$ gas are used as a Mo source, and a H$_2$S gas and/or a dimethylsulfide gas are used as a S source, in some embodiments. In other embodiments, a MoO$_3$ gas sublimed from a solid MoO$_3$ or a MoCl$_5$ source and/or S gas sublimed from a solid S source can be used. Solid sources of Mo and S are placed in a reaction chamber and a carrier gas containing inert gas, such as Ar, N$_2$ and/or He flows in the reaction chamber. The solid sources are heated to generate gaseous sources by sublimation, and the generated gaseous sources react to form MoS$_2$ molecules. The MoS$_2$ molecules are then deposited around the seed nanotubes over the substrate. The substrate is appropriately heated in some embodiments. In other embodiments, the entire reaction chamber is heated by induction heating. Other TMD layers can also be formed by CVD using suitable source gases. For example, metal oxides, such as WO$_3$, PdO$_2$ and PtO$_2$ can be used as a sublimation source for W, Pd and Pt, respectively, and metal compounds, such as W(CO)$_6$, WF$_6$, WOCl$_4$, PtCl$_2$ and PdCl$_2$ can also be used as a metal source.

In other embodiments, the seed nanotubes are immersed in, dispersed in or treated by, one or more metal precursor, such as (NH$_4$)WS$_4$, WO$_3$, (NH$_4$)MoS$_4$ or MoO$_3$ and placed over the substrate, and then a sulfur gas is provided over the substrate to form multiwall nanotubes.

In other embodiments, a carbon source gas is used to form a carbon nanotube as an outer layer over a BN or TMD inner nanotube. Three or more co-axial nanotubes are formed by repeating above processes in some embodiments. In some embodiments, multiwall nanotubes are disposed in the solution as shown in FIG. 9A. In some embodiments, a mixture of single wall nanotubes and multiwall nanotubes are disposed in the solution.

In some embodiments, when the main network membrane 550 includes nanotubes and two-dimensional material flakes, the deposition by filtration for nanotubes and the deposition by filtration for the flakes are repeated as shown in FIG. 9C. In some embodiments, a mixture of nanotubes and flakes are dispersed in the solvent, and the deposition by filtration is performed to form a mixed network layer of nanotubes and two-dimensional material flakes.

Two-dimensional material layer(s) are formed over a substrate by a CVD method, and then the deposited layer is peeled off from the substrate. After the two-dimensional material layer is peeled off, the layer is crushed into flakes in some embodiments.

FIGS. 10A and 10B to 13A and 13B show cross sectional views (the "A" figures) and plan (top) views (the "B" figures) of the various stages for manufacturing a debris catcher in accordance with an embodiment of the present disclosure. It is understood that additional operations can be provided before, during, and after the processes shown by FIGS. 10A-13B, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

Figure 10A:
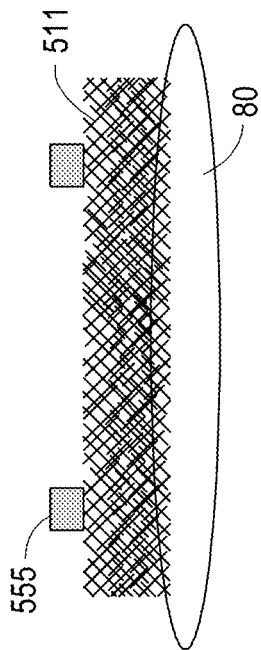
FIGS. 10A and 10B show a cross sectional view and a plan (top) view of one of the various stages for manufacturing a debris catcher in accordance with an embodiment of the present disclosure.
Figure 10B:
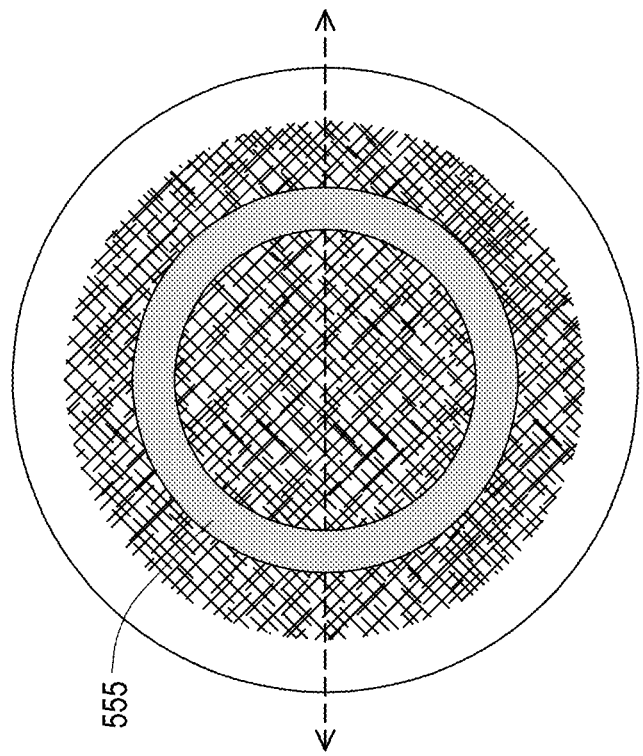

As shown in FIGS. 9A-9C, a nanotube layer 550L is formed on a support membrane 80 by deposition by filtering. As set forth above, the nanotube layer 550L include single wall nanotubes, multiwall nanotubes and/or 2D flakes. The nanotube layer 550L is then detached from a deposition apparatus, as shown in FIGS. 10A and 10B.

Figure 11A:
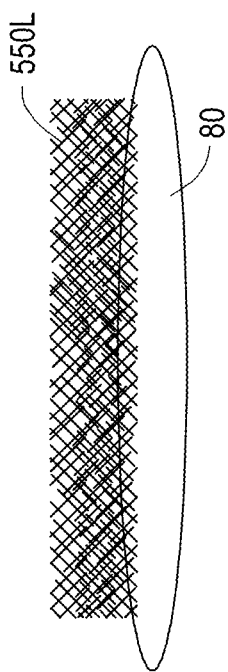
FIGS. 11A and 11B show a cross sectional view and a plan (top) view of one of the various stages for manufacturing a debris catcher in accordance with an embodiment of the present disclosure.
Figure 11B:
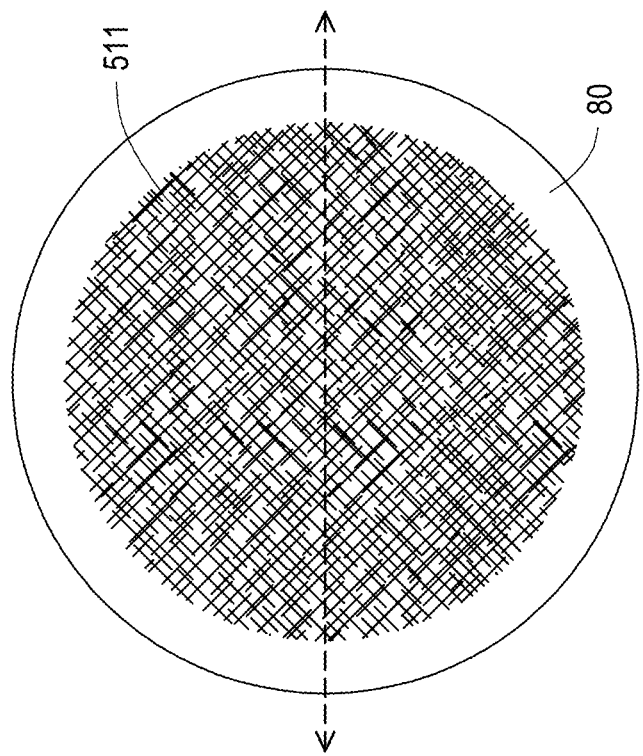

Then, as shown in FIGS. 11A and 11B, a frame 555 is attached to the nanotube layer 550L. In some embodiments, as shown in FIG. 9B, the support frame 15 has a circular ring or frame shape, but may have other shapes as shown in FIGS. 4C-4E.

Figure 12A:
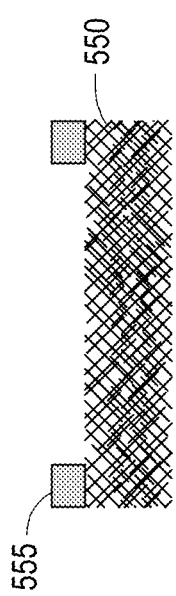
FIGS. 12A and 12B show a cross sectional view and a plan (top) view of one of the various stages for manufacturing a debris catcher in accordance with an embodiment of the present disclosure.
Figure 12B:
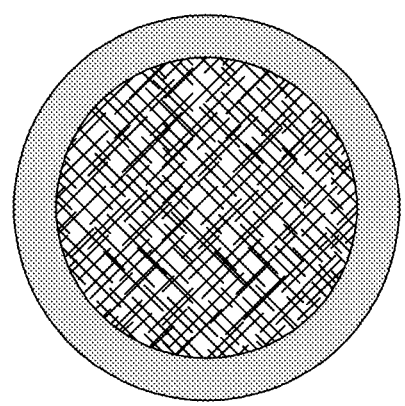

Next, as shown in FIGS. 12A and 12B, the nanotube layer 550L and the support membrane 80 are cut to form a network membrane 550 having a frame 555, and then the support substrate 80 is detached or removed, in some embodiments. When the support substrate 80 is made of an organic material, the support substrate 80 is removed by wet etching using an organic solvent.

Figure 13A:
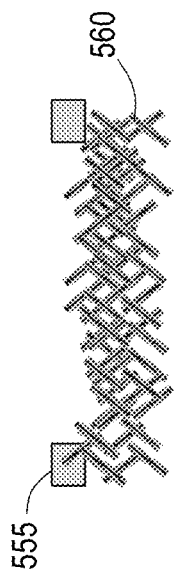
FIGS. 13A and 13B show a cross sectional view and a plan (top) view of one of the various stages for manufacturing a debris catcher in accordance with an embodiment of the present disclosure.
Figure 13B:
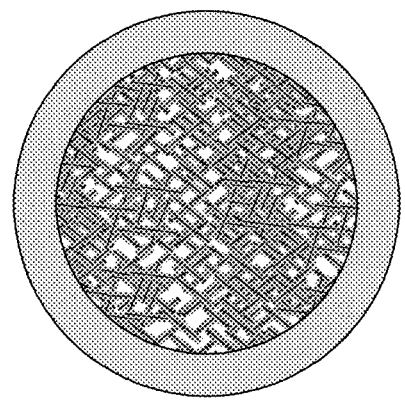

In some embodiments, when the nanotube layer 550L includes only single wall nanotubes, one or more outer tubes are formed around each of the single wall nanotubes, as shown in FIGS. 13A and 13B. In some embodiments, a CVD process is performed using the single wall nanotubes as a seed. The CVD process is repeated a desired number of times to form three or more outer tubes. In some embodiments, a cover layer similar to the first, second or third cover layers as set forth above are formed to seal the network membrane 550 or the network membrane having multiwall nanotubes 560 together with the frame 555. In some embodiments, the cover layer is formed on only one main surface of the network membrane 550 or the network membrane having multiwall nanotubes 560.

FIGS. 14A and 14B to 19A and 19B show cross sectional views (the "A" figures) and plan (top) views (the "B" figures) of the various stages for manufacturing a debris catcher mask in accordance with an embodiment of the present disclosure. It is understood that additional operations can be provided before, during, and after the processes shown by FIGS. 14A-19B, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

Figure 15A:
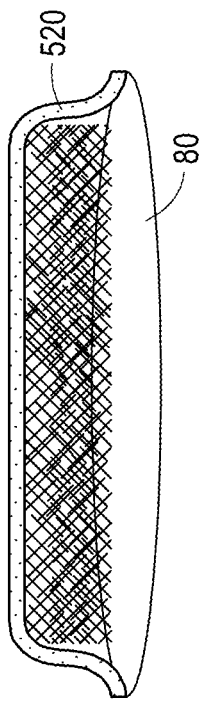
FIGS. 15A and 15B show a cross sectional view and a plan (top) view of one of the various stages for manufacturing a debris catcher in accordance with an embodiment of the present disclosure.
Figure 15B:
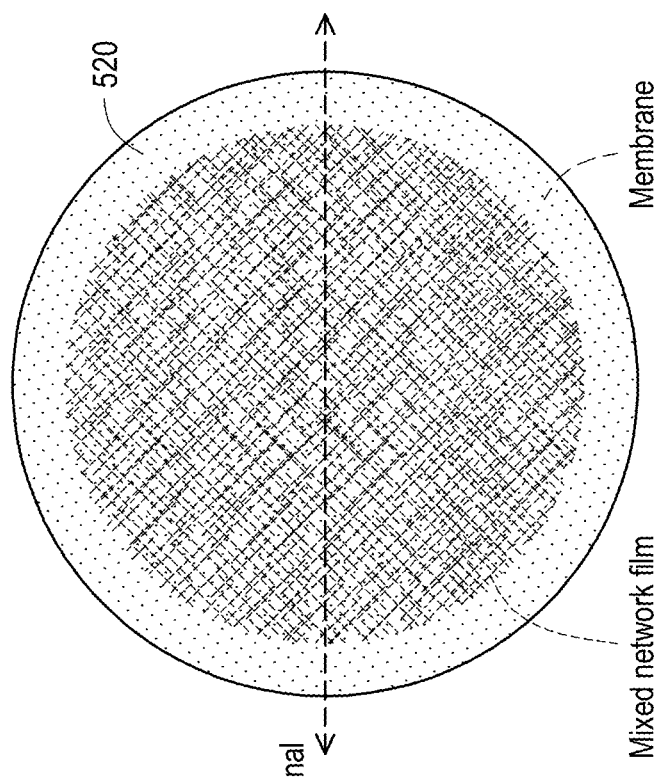
Figure 14A:
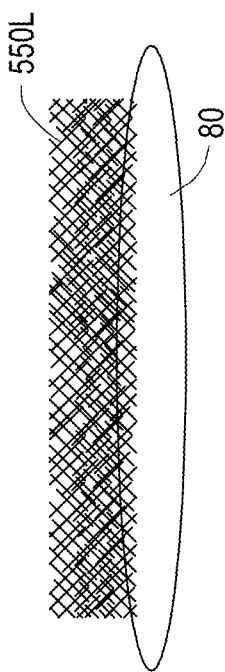
FIGS. 14A and 14B show a cross sectional view and a plan (top) view of one of the various stages for manufacturing a debris catcher in accordance with an embodiment of the present disclosure.
Figure 14B:
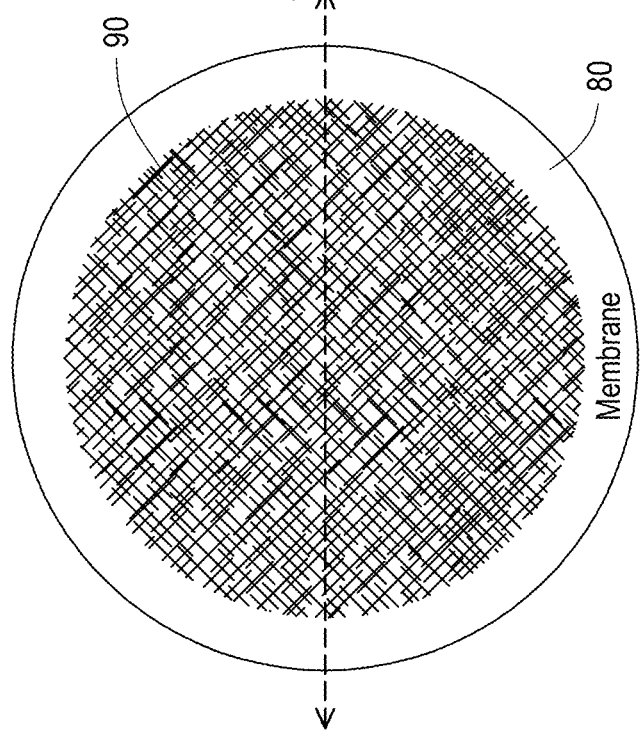

As shown in FIGS. 9A-9C, a main network membrane 550L is formed on a support membrane 80 by deposition by filtering. As set forth above, the nanotube layer 550L include single wall nanotubes, multiwall nanotubes and/or 2D flakes. The main network membrane 500L is then detached from a deposition apparatus, as shown in FIGS. 14A and 14B. Then, as shown in FIGS. 15A and 15B, a first cover layer 520 is formed over the main network membrane 550L in some embodiments.

The first cover layer 520, which is a two-dimensional material, is formed by, for example, a CVD method on a substrate, and then the deposited two-dimensional layer(s) is peeled off from the substrate. The peeled two-dimensional layer(s) is subsequently transferred over the main network layer 550L formed on the support substrate 80, as shown in FIGS. 15A and 15B.

Figure 16A:
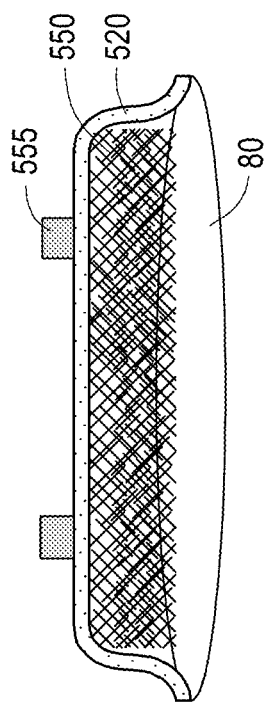
FIGS. 16A and 16B show a cross sectional view and a plan (top) view of one of the various stages for manufacturing a debris catcher in accordance with an embodiment of the present disclosure.
Figure 16B:
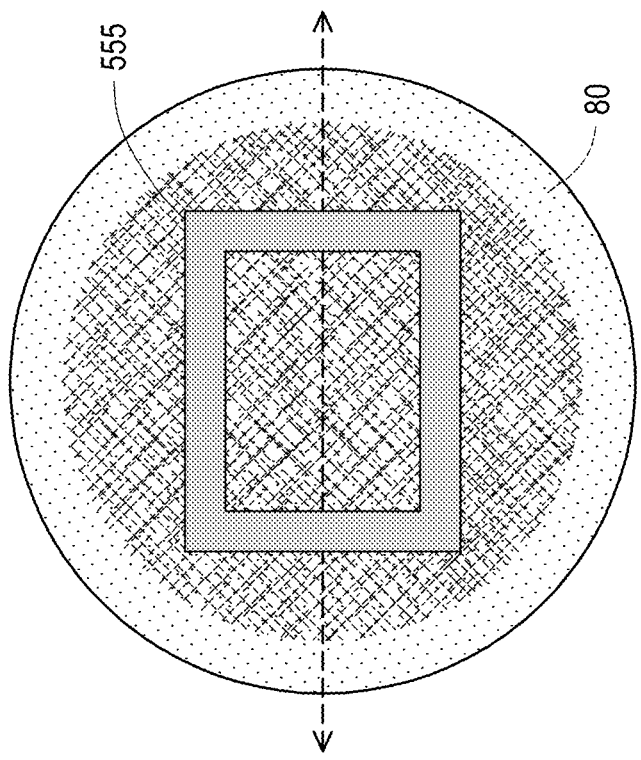

Then, as shown in FIGS. 16A and 16B, a frame 555 is attached to the first cover layer 520. In some embodiments, as shown in FIG. 16B, the frame 15 has a rectangular (including square) frame shape, and any other shape as shown in FIGS. 4B-4E can be used.

Figure 17A:
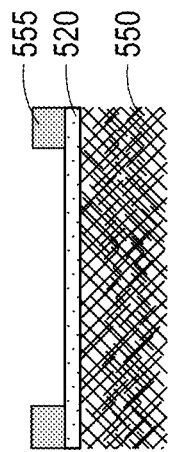
FIGS. 17A and 17B show a cross sectional view and a plan (top) view of one of the various stages for manufacturing a debris catcher in accordance with an embodiment of the present disclosure.
Figure 17B:
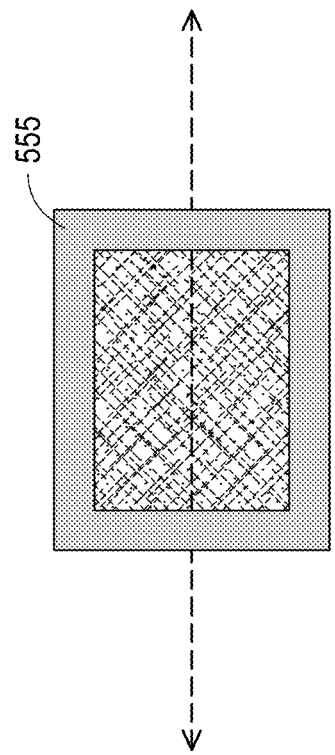

Next, as shown in FIGS. 17A and 17B, the first cover layer 520, the main network membrane 550L and the support membrane 80 are cut into a rectangular shape to form a network membrane 550 having the frame 555, and then the support substrate 80 is detached or removed, in some embodiments. When the support substrate 80 is made of an organic material, the support substrate 80 is removed by wet etching using an organic solvent.

Further, as shown in FIGS. 18A and 18B, a second cover layer 530 is formed over the network membrane 550. The operations for forming the second cover layer 530, which is a two-dimensional material, is the same as or similar to those for the first cover layer 520 as set forth above. In some embodiments, the first cover layer 520 and the second cover layer 530 are sealed at the periphery thereof to fully encapsulate the main network membrane 550.

Further, as shown in FIGS. 19A and 19B, a third cover layer 540 is optionally formed over the first cover layer 520, the second cover layer 530 and the support frame 555. In some embodiments, the third cover layer 540 is formed by CVD, physical vapor deposition (PVD) or atomic layer deposition (ALD).

Figure 20A:
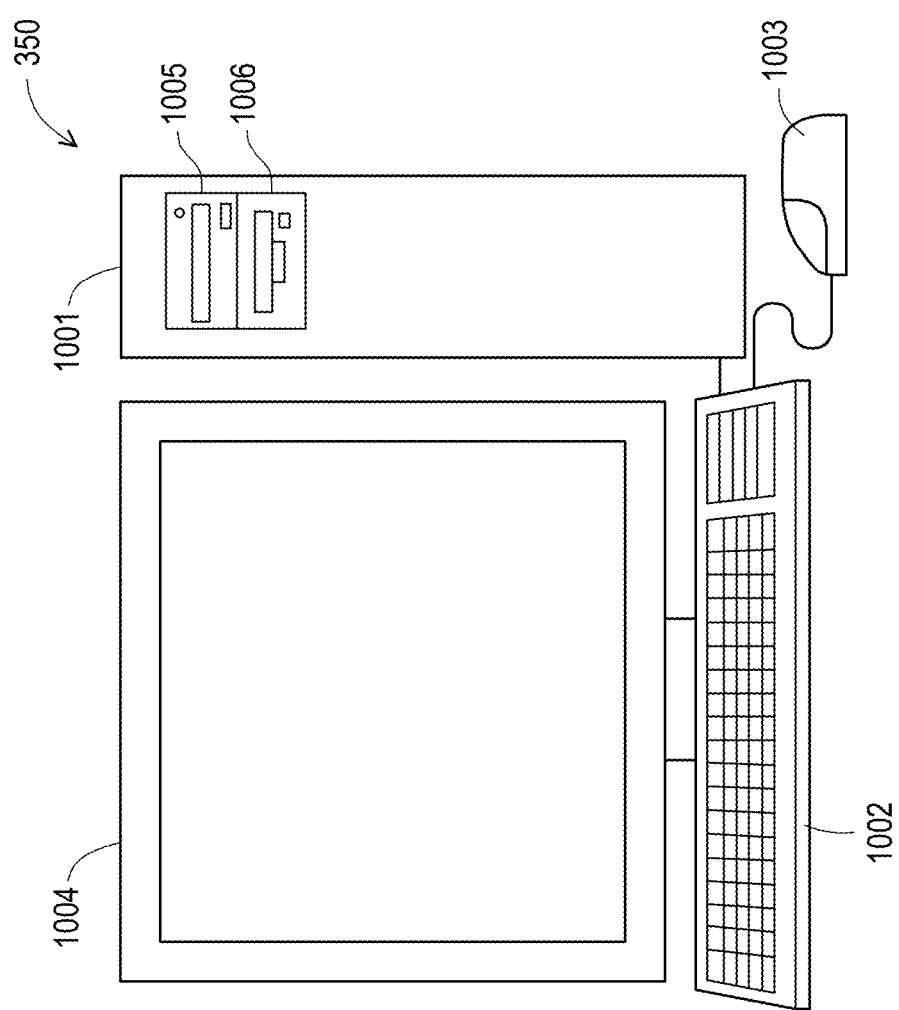
FIG. 20A and FIG. 20B are diagrams of a controller in accordance with some embodiments.
Figure 20B:
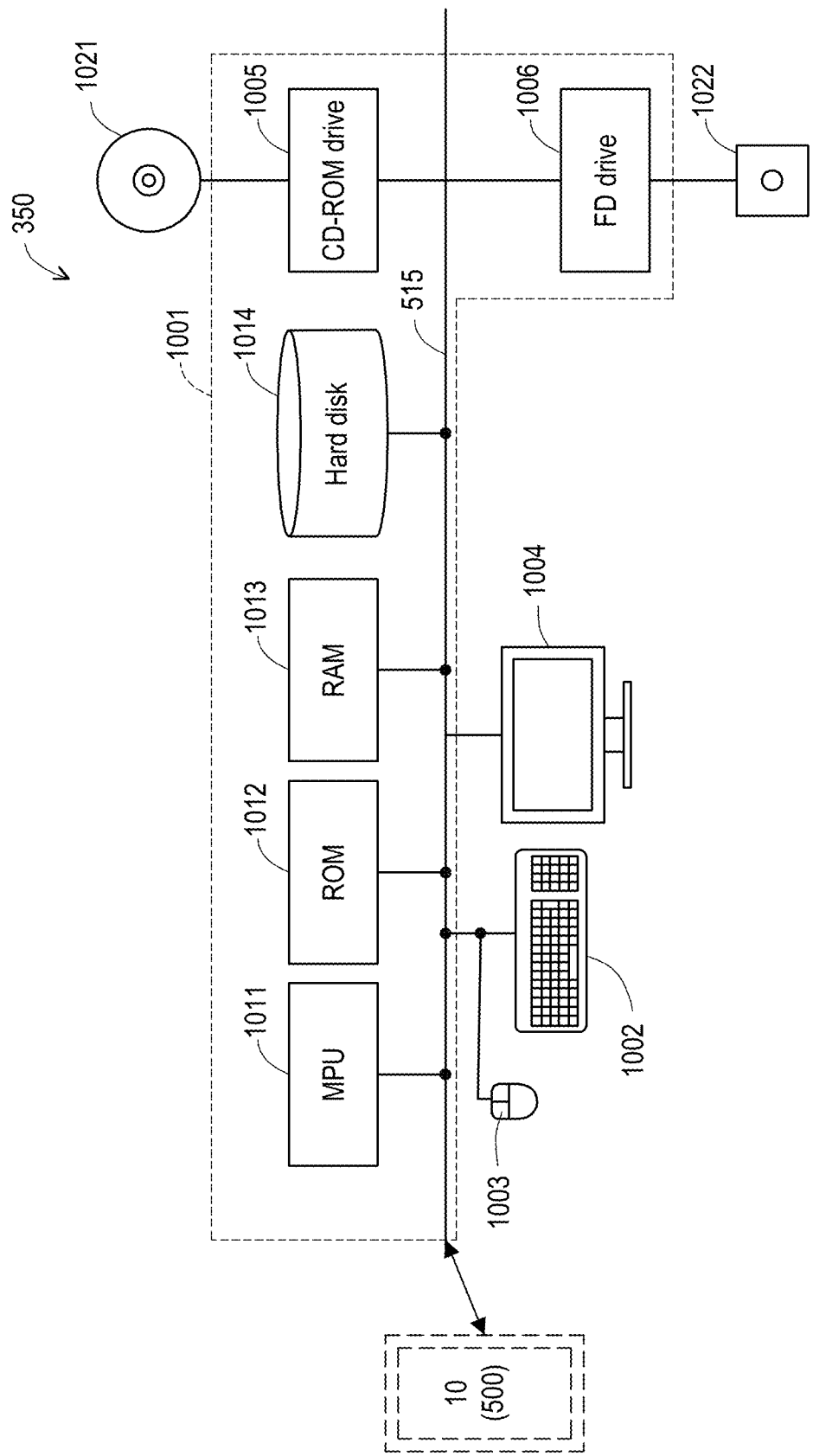

FIG. 20A and FIG. 20B illustrate a computer system 350 for controlling the EUV exposure system 10 including the debris catcher 500 and its components in accordance with various embodiments of the present disclosure. FIG. 20A is a schematic view of a computer system 350 that controls the system 10 including the debris catcher 500 of FIGS. 1A-1C, 2 and 3A-3C. In some embodiments, the computer system 350 is programmed to initiate a process for switching the slots/frames as shown in FIGS. 3A-3C according to information from one or more sensors provided to the EUV exposure system.

As shown in FIG. 20A, the computer system 350 is provided with a computer 1001 including an optical disk read only memory (e.g., CD-ROM or DVD-ROM) drive 1005 and a magnetic disk drive 1006, a keyboard 1002, a mouse 1003 (or other similar input device), and a monitor 10504.

FIG. 20B is a diagram showing an internal configuration of the computer system 350. In FIG. 20B, the computer 1001 is provided with, in addition to the optical disk drive 1005 and the magnetic disk drive 1006, one or more processors 1011, such as a micro-processor unit (MPU) or a central processing unit (CPU); a read-only memory (ROM) 1012 in which a program such as a boot up program is stored; a random access memory (RAM) 1013 that is connected to the processors 1011 and in which a command of an application program is temporarily stored, and a temporary electronic storage area is provided; a hard disk 1014 in which an application program, an operating system program, and data are stored; and a data communication bus 1015 that connects the processors 1011, the ROM 1012, and the like. Note that the computer 1001 may include a network card (not shown) for providing a connection to a computer network such as a local area network (LAN), wide area network (WAN) or any other useful computer network for communicating data used by the computer system 350 and the EUV exposure system 10. In various embodiments, the controller 350 communicates via wireless or hardwired connection to the EUV exposure system 10 and its components.

The program for causing the computer system 350 to execute the process for controlling the debris catcher 500 of FIGS. 2 and 3A-3C to execute switching the slots/frames as set forth above according to the embodiments disclosed herein are stored in an optical disk 1021 or a magnetic disk 1022, which is inserted into the optical disk drive 1005 or the magnetic disk drive 1006, and transmitted to the hard disk 1014. Alternatively, the program is transmitted via a network (not shown) to the computer system 350 and stored in the hard disk 1014. At the time of execution, the program is loaded into the RAM 1013. The program is loaded from the optical disk 1021 or the magnetic disk 1022, or directly from a network in various embodiments.

The stored programs do not necessarily have to include, for example, an operating system (OS) or a third party program to cause the computer 1001 to execute the methods disclosed herein. The program may only include a command portion to call an appropriate function (module) in a controlled mode and obtain desired results in some embodiments. In various embodiments described herein, the controller 1050 is in communication with the EUV exposure system 10 to control various functions thereof.

The controller 350 is coupled to the EUV exposure system 10 including the debris catcher 500 in various embodiments. The controller 350 is configured to provide control data to those system components and receive process and/or status data from those system components. For example, the controller 350 comprises a microprocessor, a memory (e.g., volatile or non-volatile memory), and a digital I/O port capable of generating control voltages sufficient to communicate and activate inputs to the processing system, as well as monitor outputs from the EUV exposure system 10. In addition, a program stored in the memory is utilized to control the aforementioned components of the EUV exposure system 10 according to a process recipe. Furthermore, the controller 350 is configured to analyze the process and/or status data, to compare the process and/or status data with target process and/or status data, and to use the comparison to change a process and/or control a system component. In addition, the controller 350 is configured to analyze the process and/or status data, to compare the process and/or status data with historical process and/or status data, and to use the comparison to predict, prevent, and/or declare a fault or alarm.

As set forth above, the executed program causes the processor or computer to switch one slot or frame having the network membrane to another slot or frame having the network membrane according to degradation degree of the network membrane 550. In some embodiments, the degradation degree is determined by the time duration for which the network membrane is used. In some embodiments, the executed program causes the processor or computer to issue a switching signal periodically, for example, every day, week or month. In other embodiments, the switching signal is provided every certain number of pulses of the excitation laser. In some embodiments, the switching signal is provided when an intensity of the EUV radiation in the scanner side (or in the LPP radiation side) decreased below a threshold. In some embodiments, a weight monitor 411 (see, FIG. 2) is provided inside or near the lower cone 400 to monitor a weight of the accumulated Sn, and when the amount of Sn exceeds a threshold, the switching signal is provided. In some embodiments, the EUV intensity is measured at the scanner side when the currently used network membrane is used and when the empty slot (through opening) is used, and when the difference in the intensities is greater than a threshold, a new network membrane is used by rotating the debris catcher as shown in FIGS. 3A and 3B or by sliding the debris catcher as shown in FIG. 3C.

In accordance with the foregoing, improved debris mitigation is achieved in order to prevent mask fall-on defects and the like in a semiconductor manufacturing process. Taking advantages of the off period of the EUV light pulse generation cycle, a debris catcher is provided at the interface between the source and scanner chambers to pass a substantial amount of EUV light beam and block tin debris (e.g. nanoparticle debris). In such a manner, an operation period (time between maintenance operations) of the EUV radiation system can be prolonged from about a month (without a debris catcher) to about 6 months with the debris catcher.

According to various embodiments, an EUV lithography apparatus includes a light source that generates an EUV light beam, a scanner that receives the light from a junction with the light source and directs the light to a reticle stage, and a debris catcher disposed on a EUV beam path between the light source and the scanner. The debris catcher includes a network membrane including a plurality of nano-fibers. In one or more of the foregoing or following embodiments, the plurality of nano-fibers include a plurality of carbon nanotubes. In one or more of the foregoing or following embodiments, the plurality of nano-fibers include a plurality of nanotubes of a transition metal dichalcogenide. In one or more of the foregoing or following embodiments, the plurality of nano-fibers include a plurality of co-axial nanotubes, each of which includes an inner tube and one or more outer tubes surrounding the inner tube. In one or more of the foregoing or following embodiments, two of the inner tube and one or more outer tubes are made of different materials from each other. In one or more of the foregoing or following embodiments, each of the inner tube and the one or more outer tubes is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te. In one or more of the foregoing or following embodiments, the inner tube is a carbon nanotube. In one or more of the foregoing or following embodiments, the debris catcher further includes a first layer and a second layer, and the network membrane is disposed between the first layer and second layer. In one or more of the foregoing or following embodiments, the first layer includes a first two-dimensional material and the second layer includes a second two-dimensional material. In one or more of the foregoing or following embodiments, each of the first and second two-dimensional materials includes at least one selected from the group consisting of boron nitride (BN), graphene, $MoS_2$, $MoSe_2$, $WS_2$, and $WSe_2$. In one or more of the foregoing or following embodiments, wherein the first two-dimensional material is different from the second two-dimensional material.

In accordance with another aspect of the present disclosure, an EUV lithography apparatus includes a light source that generates an EUV light beam, a scanner that receives the light from a junction with the light source and directs the light to a reticle stage, and a debris catcher disposed on a EUV beam path between the light source and the scanner. The debris catcher comprises a plurality of slots or frames, and at least two of the plurality of slots or frames include a network membrane including a plurality of nano-fibers. In one or more of the foregoing or following embodiments, the EUV lithography apparatus further includes a controller configured to switch from one slot or frame of the debris catcher having the network membrane to another slot or frame of the debris catcher having the network membrane according to degradation of the network membrane of the one slot or frame. In one or more of the foregoing or following embodiments, the debris catcher includes a revolver plate rotatable around a rotational axis and the plurality of slots are provided to the revolver plate. In one or more of the foregoing or following embodiments, the debris catcher comprises the plurality of frames, a rotatable mechanism and an arm connecting the rotatable mechanism and each of the plurality of frames. In one or more of the foregoing or following embodiments, the debris catcher comprises a slidable plate and the plurality of slots are provided to the slidable plate. In one or more of the foregoing or following embodiments, wherein one of the plurality of slots or frame has no network membrane. In one or more of the foregoing or following embodiments, the plurality of nano-fibers include a plurality of carbon nanotubes or a plurality of nanotubes of a transition metal dichalcogenide.

In accordance with another aspect of the present disclosure, in a method of operating an EUV lithography apparatus, the EUV lithography apparatus includes a light source that generates an EUV light beam and a scanner that receives the light from a junction with the light source and directs the light to a reticle stage. In the method, a debris catcher is provided on a EUV beam path between the light source and the scanner, and the tin debris generated in the light source is collected by the debris catcher. The debris catcher includes a plurality of slots or frames, and at least two of the plurality of slots or frames include a network membrane including a plurality of nano-fibers. In one or more of the foregoing or following embodiments, the plurality of nano-fibers include a plurality of carbon nanotubes or a plurality of nanotubes of a transition metal dichalcogenide. In one or more of the foregoing or following embodiments, one slot or frame of the debris catcher having the network membrane is switched to another slot or frame of the debris catcher having the network membrane according to degradation of the network membrane of the one slot or frame.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultra violet (EUV) lithography apparatus, comprising:
 a light source that generates an EUV light beam;
 a scanner that receives the light from a junction with the light source and directs the light to a reticle stage; and
 a debris catcher disposed on a EUV beam path between the light source and the scanner,
 wherein the debris catcher comprises a network membrane including a plurality of nano-fibers, and the plurality of nano-fibers include a plurality of nanotubes of a transition metal dichalcogenide.

2. The EUV lithography apparatus of claim 1, wherein the plurality of nano-fibers further include a plurality of carbon nanotubes.

3. The EUV lithography apparatus of claim 1, wherein the plurality of nano-fibers include a plurality of co-axial nanotubes, each of which includes an inner tube and one or more outer tubes surrounding the inner tube.

4. The EUV lithography apparatus of claim 3, wherein the inner tube and one or more outer tubes are made of different materials from each other.

5. The EUV lithography apparatus of claim 4, wherein each of the inner tube and the one or more outer tubes is one selected from the group consisting of a carbon nanotube, a boron nitride nanotube, a transition metal dichalcogenide (TMD) nanotube, where TMD is represented by $MX_2$, where M is one or more of Mo, W, Pd, Pt, or Hf, and X is one or more of S, Se or Te.

6. The EUV lithography apparatus of claim 5, wherein the inner tube is a carbon nanotube.

7. The EUV lithography apparatus of claim 1, wherein the debris catcher further comprises:
  a first layer; and
  a second layer,
  wherein the network membrane is disposed between the first layer and second layer.

8. The EUV lithography apparatus of claim 7, wherein the first layer includes a first two-dimensional material and the second layer includes a second two-dimensional material.

9. The EUV lithography apparatus of claim 8, wherein each of the first and second two-dimensional materials includes at least one selected from the group consisting of boron nitride (BN), graphene, $MoS_2$, $MoSe_2$, $WS_2$, and $WSe_2$.

10. The EUV lithography apparatus of claim 9, wherein the first two-dimensional material is different from the second two-dimensional material.

11. An extreme ultra violet (EUV) lithography apparatus, comprising:
  a light source that generates an EUV light beam;
  a scanner that receives the light from a junction with the light source and directs the light to a reticle stage; and
  a debris catcher disposed on a EUV beam path between the light source and the scanner,
  wherein the debris catcher comprises a plurality of slots or frames, and
  at least two of the plurality of slots or frames include a network membrane including a plurality of nano-fibers, and the plurality of nano-fibers comprise a nanotube of a transition metal dichalcogenide.

12. The EUV lithography apparatus of claim 11, further comprising a controller configured to switch from one slot or frame of the debris catcher having the network membrane to another slot or frame of the debris catcher having the network membrane according to degradation of the network membrane of the one slot or frame.

13. The EUV lithography apparatus of claim 12, wherein the debris catcher comprises a revolver plate rotatable around a rotational axis and the plurality of slots are provided in the revolver plate.

14. The EUV lithography apparatus of claim 12, wherein the debris catcher comprises the plurality of frames, a rotatable mechanism and an arm connecting the rotatable mechanism and each of the plurality of frames.

15. The EUV lithography apparatus of claim 12, wherein the debris catcher comprises a slidable plate and the plurality of slots are provided in the slidable plate.

16. The EUV lithography apparatus of claim 11, wherein one of the plurality of slots or frame has no network membrane.

17. The EUV lithography apparatus of claim 11, wherein the plurality of nano-fibers further comprises a plurality of carbon nanotubes.

18. A method of operating an extreme ultra violet (EUV) lithography apparatus comprising a light source that generates an EUV light beam and a scanner that receives the light from a junction with the light source and directs the light to a reticle stage, the method comprising:
  providing a debris catcher on a EUV beam path between the light source and the scanner, the debris catcher comprising a plurality of slots or frames, at least two of the plurality of slots or frames include a network membrane including a plurality of nano-fibers comprising a plurality nanotubes of a transition metal dichalcogenide; and
  collecting by the debris catcher tin debris generated in the light source.

19. The method of claim 18, wherein the plurality of nano-fibers include further comprises a plurality of carbon nanotubes.

20. The method of claim 19, further comprising switching from one slot or frame of the debris catcher having the network membrane to another slot or frame of the debris catcher having the network membrane according to degradation of the network membrane of the one slot or frame.

* * * * *